United States Patent [19]

Urai

[11] Patent Number: 5,684,747
[45] Date of Patent: Nov. 4, 1997

[54] METHOD FOR ERASING NONVOLATILE SEMICONDUCTOR MEMORY DEVICE INCORPORATING REDUNDANCY MEMORY CELLS

[75] Inventor: Takahiko Urai, Tokyo, Japan

[73] Assignee: NEC Corporation, Tokyo, Japan

[21] Appl. No.: 613,911

[22] Filed: Mar. 11, 1996

[30]  Foreign Application Priority Data

Mar. 10, 1995 [JP] Japan ..................... 7-079850

[51] Int. Cl.$^6$ ......................................... G11C 7/00
[52] U.S. Cl. ............. 365/200; 365/185.22; 365/185.29; 365/218
[58] Field of Search .......................... 365/200, 201, 365/218, 185.29, 185.22

[56]  References Cited

U.S. PATENT DOCUMENTS

| 5,347,489 | 9/1994 | Merchant et al. | 365/203 |
| 5,357,475 | 10/1994 | Hasbun et al. | 365/218 |
| 5,428,569 | 6/1995 | Kato et al. | 365/185 |
| 5,485,424 | 1/1996 | Kawamura | 365/200 |
| 5,559,742 | 9/1996 | Lee et al. | 365/200 |

FOREIGN PATENT DOCUMENTS

| 4-159696 | 6/1992 | Japan | 365/218 |

*Primary Examiner*—David C. Nelms
*Assistant Examiner*—Hien Nguyen
*Attorney, Agent, or Firm*—Sughrue, Mion, Zinn, Macpeak & Seas, PLLC

[57]  ABSTRACT

In a nonvolatile memory device, a write operation is performed upon used memory cells. Then, an erase operation is performed upon the used memory cells as well as unused memory cells. Finally, a write operation is performed upon only the unused memory cells.

13 Claims, 20 Drawing Sheets

Fig. 3
PRIOR ART
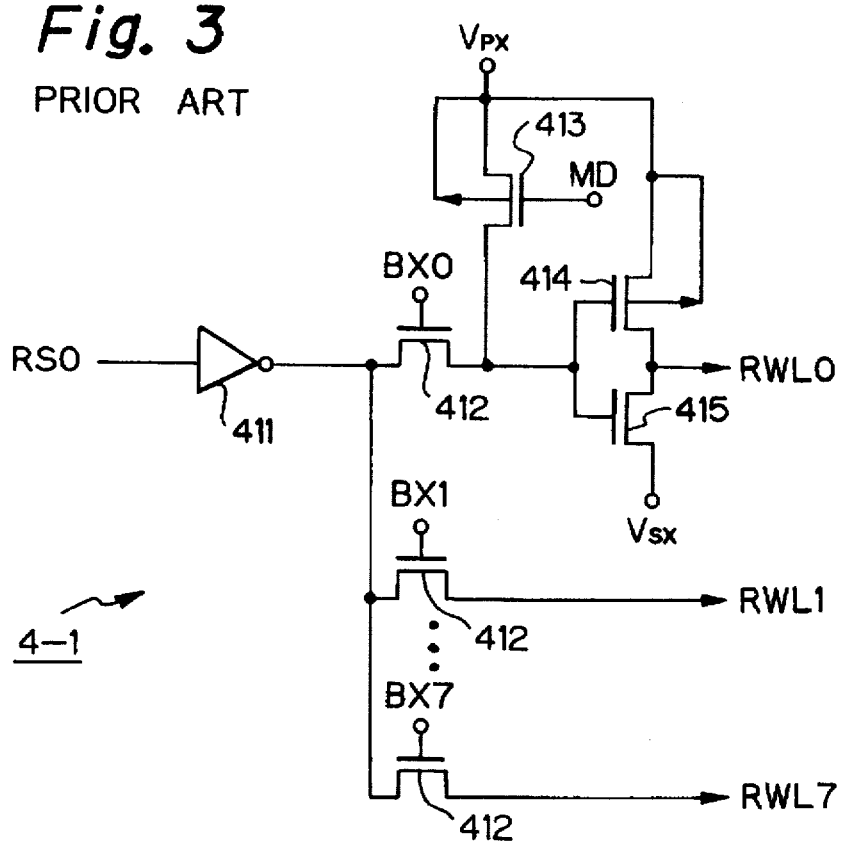
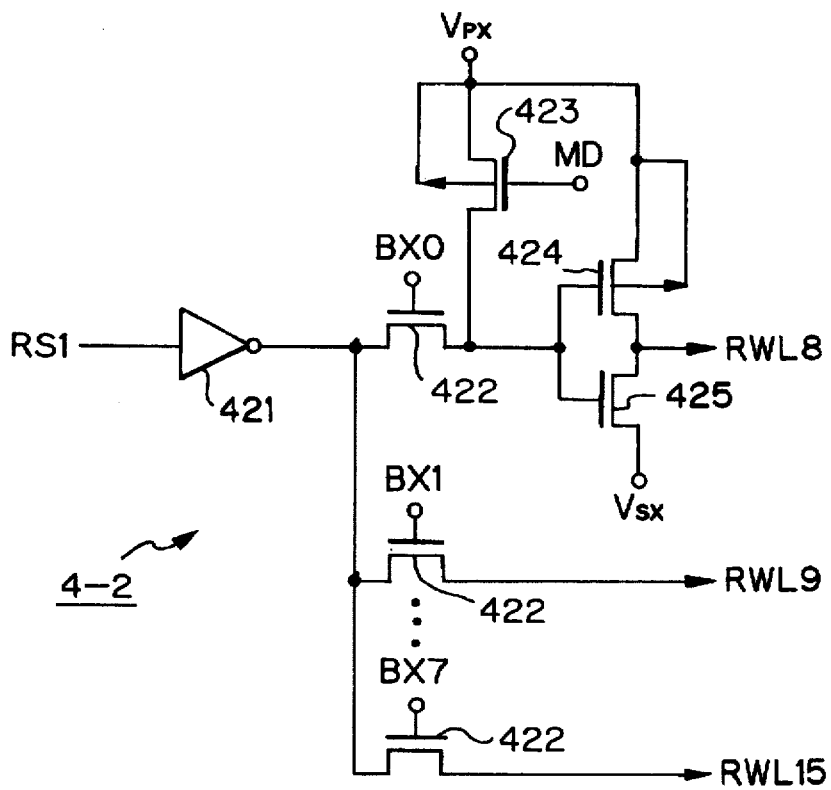

☐ USED MEMORY CELLS

▨ UNUSED MEMORY CELLS

✗ DEFECTIVE MEMORY CELL

METHOD FOR ERASING NONVOLATILE SEMICONDUCTOR MEMORY DEVICE INCORPORATING REDUNDANCY MEMORY CELLS

BACKGROUND OF THE INVENTION

1. Field of the Invention

The present invention relates to a nonvolatile semiconductor memory device, and more particulary, to a method for erasing a nonvolatile memory device incorporating redundancy memory cells.

2. Description of the Related Art

In a nonvolatile semiconductor memory device, a write operation can be carried out after the device is mounted on a printed circuit board. One typical example of such a device is a flash memory which has an advantage in that data storage is possible without a backup battery and which is highly integrated. Generally, a memory cell of the flash memory is comprised of a semiconductor substrate having an $N^+$-type source region, an $N^+$-type drain region connected to a bit line, a floating gate over a channel region of the substrate, and a control gate over the floating gate. The control gate is connected to a word line.

In a flash erase mode, when a positive high voltage is applied to the source region and the control gate is grounded, electrons stored in the floating gate are expelled therefrom. In this case, since the amount of electrons stored in the floating gate immediately before the erase mode affects the threshold voltage of the cell after the erase mode, the threshold voltage is greatly fluctuated. At worst, the threshold voltage of the cell is mode negative by an over-erase phenomenon, i.e., the cell becomes a depletion-type transistor.

When writing the depletion-type cell, a large leakage current flows between the drain region and the source region to reduce the potential at the drain region, so that it is impossible to carry out a write operation. Also, since a leakage current flows through the depletion-type cell which is non-selected, the other cells connected to the same bit line of the depletion-type cell are deemed to be in an ON state.

In order to avoid the above-mentioned over-erase phenomenon, a write operation before the flash erase operation is performed upon all the memory cells, to converge the threshold voltages.

On the other hand, in recent years, even in the nonvolatile memory device, redundancy memory cells are introduced thereinto. That is, if a defective memory cell is found in normal memory cells, the defective memory cell is replaced by its corresponding redundancy memory cell. Thus, the problem of the defective memory cell is alleviated.

In a prior art method for erasing a nonvolatile semiconductor device incorporating redundancy memory cells, a write operation immediately before a flash erase operation is performed upon the redundancy memory cells as well as the normal memory cells, thus avoiding an over-erase operation for the unused memory cells (see: JP-A-4-159695). This will be explained later in detail.

In the above-described prior art method, however, although the unused memory cells are actually unused, if at least one of the unused memory cells is over-erased, i.e., of a depletion type, the device is automatically determined to be failed, thus reducing the manufacturing yield of the device.

In addition, it has been reported that an erratic erase phenomenon may occur in a nonvolatile memory device. That is, an accidental and temporary over-erase phenomenon by traps of holes occurs, and this phenomenon is dissolved by the next write operation. Therefore, it is hard to find the erratic erase phenomenon. Thus in view of the erratic erase phenomenon, the unused memory cells as well as the used memory cells may be over-erased.

SUMMARY OF THE INVENTION

It is an object of the present invention to avoid an over-erase phenomenon for the unused memory cells of a nonvolatile semiconductor memory device incorporating redundancy memory cells, thus enhancing the manufacturing yield of the device.

According to the present invention, in a nonvolatile memory device, a write operation is performed upon used memory cells. Then, an erase operation is performed upon the used memory cells as well as unused memory cells. Finally, a write operation is performed upon only the unused memory cells. Thus, the threshold voltages of the unused memory cells are made higher, and accordingly, the depletion phenomenon hardly occurs in the unused memory cells.

BRIEF DESCRIPTION OF THE DRAWINGS

The present invention will be more clearly understood from the description as set forth below, as compared with the prior art, with reference to the accompanying drawings, wherein:

FIG. 3 is a detailed circuit diagram of the redundancy row decoders of FIG. 1;

DESCRIPTION OF THE PREFERRED EMBODIMENTS

Before the description of the preferred embodiments, a prior art semiconductor memory device incorporating redundancy memory cells and a prior art method for erasing the device will be explained with reference to FIGS. 1A, 1B, 2 through 10, 11A, 11B, 11C and 11D.

Figure 1A:
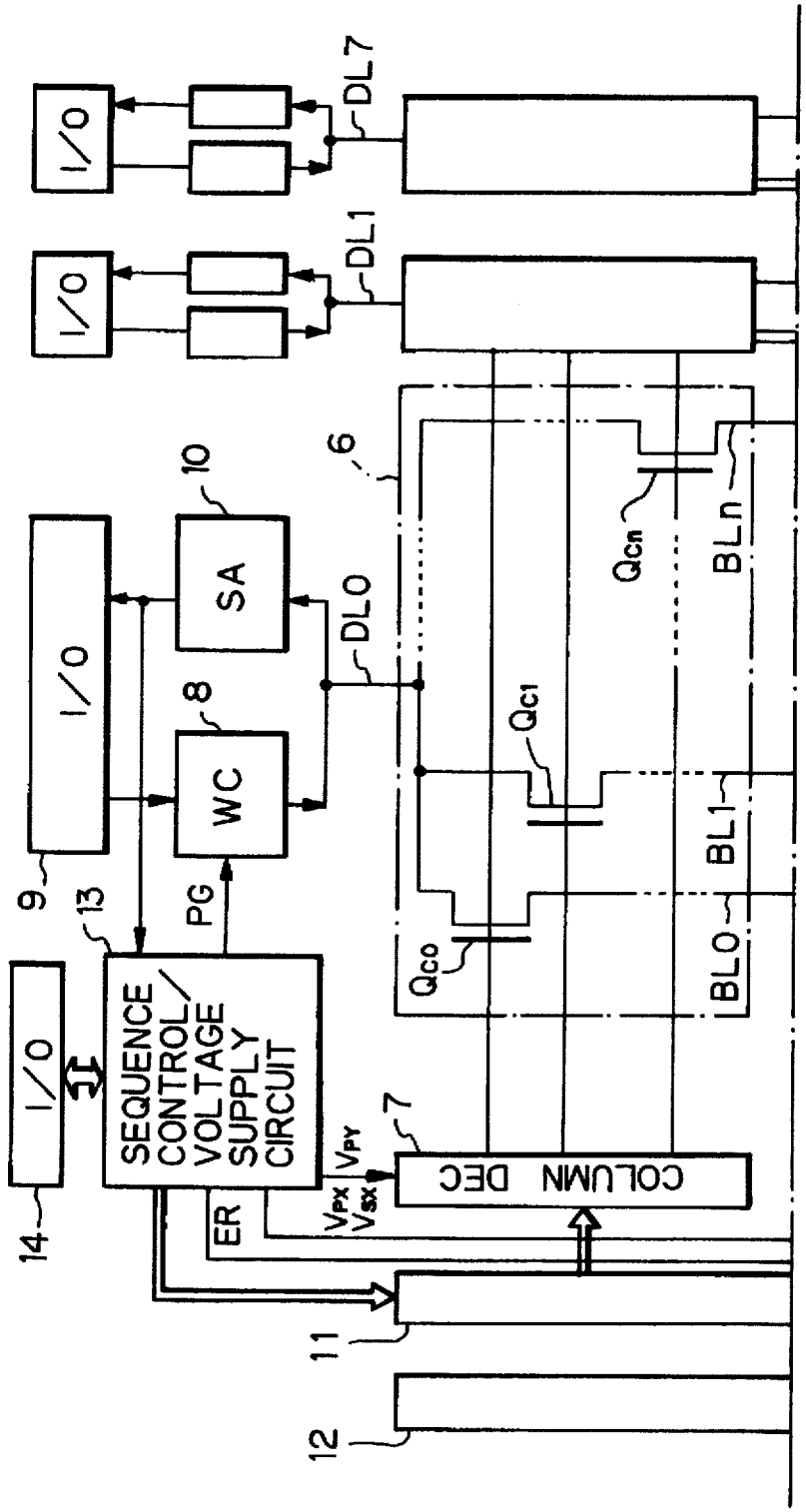
FIGS. 1A and 1B are block circuit diagrams illustrating a prior art semiconductor memory device incorporating redundancy memory cells.
Figure 1B:
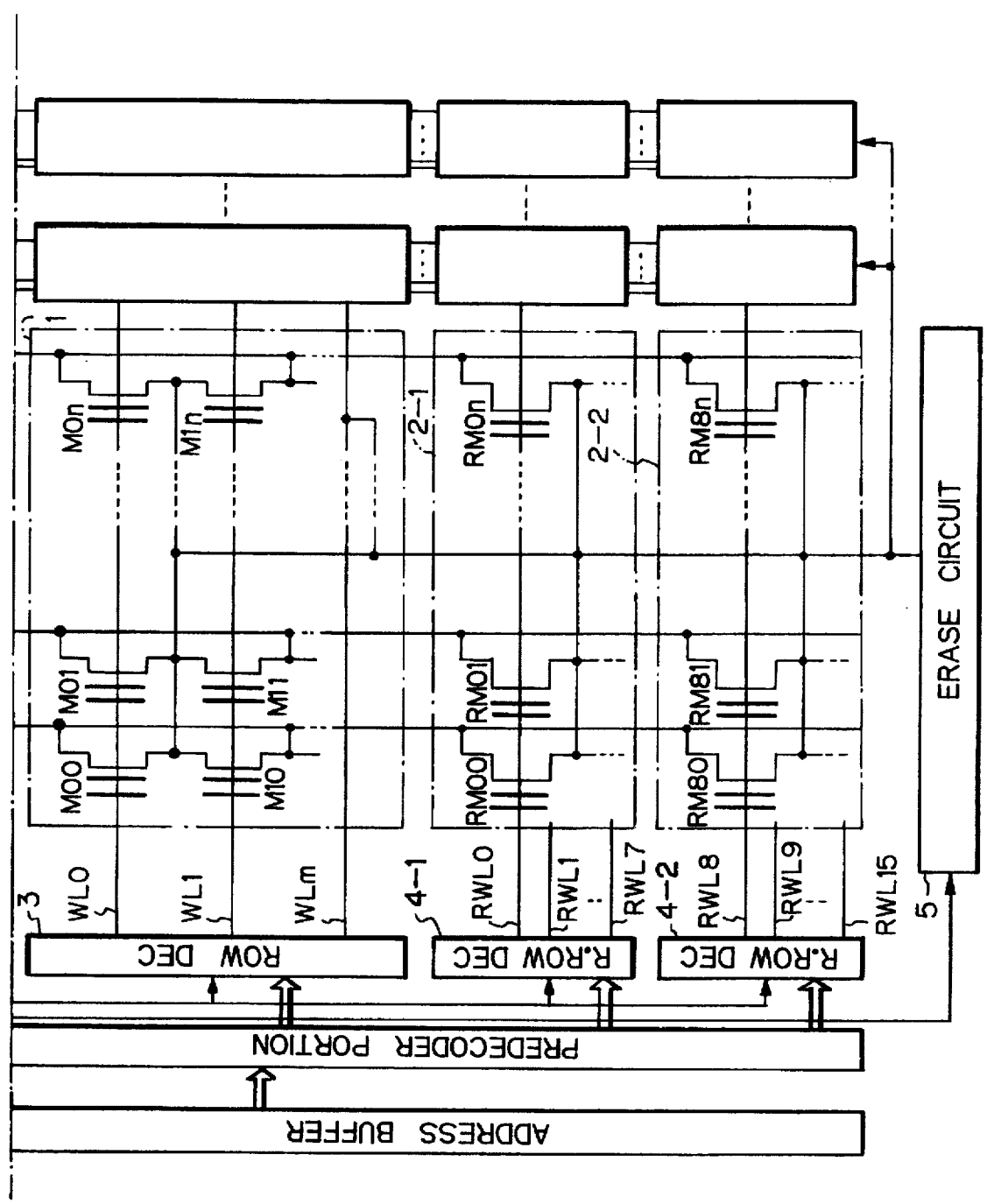

In FIGS. 1A and 1B, which illustrate a prior art semiconductor memory device, a plurality of word lines WL0, WL1, . . . , WLm, a plurality of redundancy word lines RWL0, RWL1, . . . , RWL7, RWL8, RWL9, . . . , RWL15, and bit lines BL0, BL1, . . . , BLn are provided. Reference numeral 1 designates a normal memory cell array formed by normal memory cells M00, M01, . . . , N0n, M10, M11, . . . each of which has a source, a drain connected to one of the bit lines BL0, BL1, . . . , BLn, a floating gate and a control gate connected to one of the word lines WL1, WL2, . . . , WLm.

A redundancy memory cell array 2-1 is formed by redundancy memory cells RM00, RM01, . . . , RM0n, . . . , each of which has a source, a drain connected to one of the bit lines BL0, BL1, . . . , BLn, a floating gate and a control gate connected to one of the redundancy word lines RWL0, RWL1, . . . , RWL7. Similarly, a redundancy memory cell array 2-2 is formed by redundancy memory cells RM80, RM81, . . . , RM8n, . . . , each of which has a source, a drain connected to one of the bit lines BL0, BL1, . . . , BLn, a floating gate and a control gate connected to one of the redundancy word lines RWL8, RWL9, . . . , RWL15.

A row decoder 3 selects one of the word lines WL0, WL1, . . . , WLm. Also, a redundancy row decoder 4-1 selects one of the redundancy word lines RWL0, RWL1, . . . , RWL7, and a redundancy row decoder 4-2 selects one of the redundancy word lines RWL8.

An erase circuit 5 is connected to all the sources of the normal memory cells M00, M01, . . . , M0n, . . . , and the redundacy memory cells RM00, RM01, . . . , RM0n, . . . . As a result, during an erase mode, the voltages at the sources are caused to be high (=$V_{pp}$). On the contrary, during a write/read mode, the sources are grounded.

A column selection circuit 6 is comprised of column selection transistors $Q_{c0}, Q_{c1}, \ldots , Q_{cn}$, each between one of the bit lines BL0, BL1, . . . , BLn and a digit line DL0. One of the column selection transistors $Q_{c0}, Q_{c1}, \ldots , Q_{cn}$, is selected and turned ON by a column decoder 7.

A write circuit 8 receives an input data signal from an imput/output buffer 9 and transmits it to the digit line DL0. Also, a sense circuit 10 senses data at the digit line DL0 and transmits it to the input/output buffer 9.

The row decoder 3, the redundancy row decoders 4-1 and 4-2, and the column decoder 7 are controlled by receiving address signals from a predecoder portion 11 which also receives external address signals from an address buffer 12 and internal address signals from a sequence control/voltage supply circuit 13.

The sequence control/voltage supply circuit 13 receives control signals from an input/output buffer 14 to control the entire device. Also, the sequence control/voltage supply circuit 13 supplies power supply voltages such as $V_{PX}$ and $V_{PY}$ to the elements of the device.

Note that the normal memory cell array 1, the redundancy memory cell arrays 2-1 and 2-2, the column switching circuit 6, the write circuit 8, the input/output buffer 9 and the sense amplifier 10 form one block; other blocks such as seven blocks the same as this block are also provided and are connected to the erase circuit 5.

Each element of the device of FIG. 1 is explained next with reference to FIGS. 2 to 8.

Figure 2:
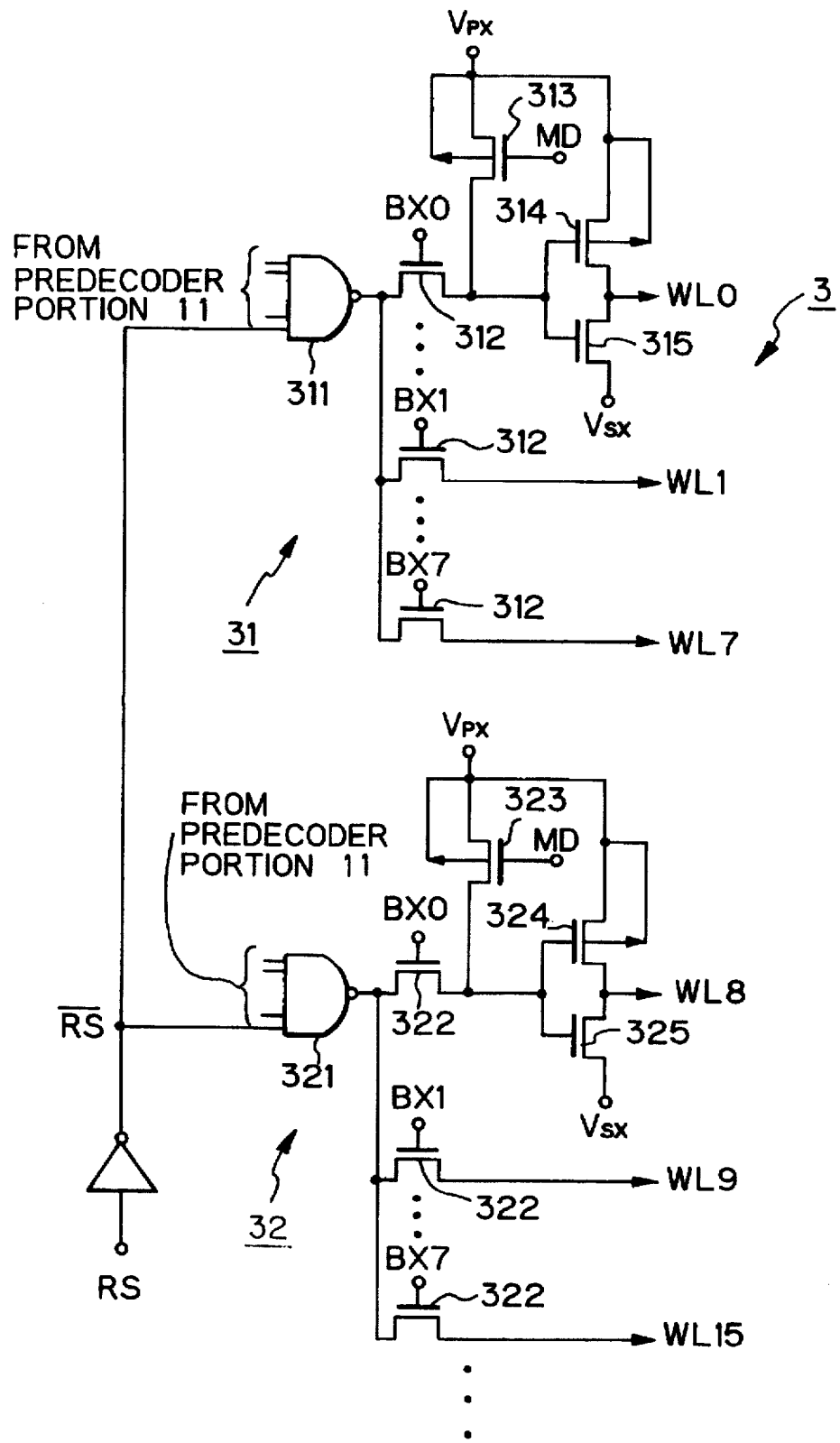
FIG. 2 is a detailed circuit diagram of the row decoder of FIG. 1.

In FIG. 2, which is a detailed circuit diagram of the row decoder 3 of FIG. 1, circuits 31, 32, . . . , which have the same configuration, are provided for every eight word lines such as WL0, WL1, . . . , WL7. For example, the circuit 31 is comprised of a NAND circuit 311 for receiving address signals from the predecoder portion 11, eight transfer gate transistors 312, P-channel MOS transistors 313 and 314, and an N-channel MOS transistor 315. In this case, the transistors 314 and 315 form a CMOS inverter. Also, the NAND circuit 311 receives an inverted signal of a redundancy selection signal RS. Therefore, when the redundancy selection signal RS is high (active), i.e., the redundancy memory cell array 4-1 or 4-2 is selected, the NAND circuit 311 (321) is disabled. Contrary to this, when the redundancy selection signal RS is low (inactive), i.e., the redundancy memory cell arrays 4-1, and 4-2 are not selected, the NAND circuit 311 (321) is enabled. That is, the output of one of the NAND circuits 311, 321, . . . is low. Also, one of the predecode signals BX0, BX1, . . . , BX7 is made high. For example, if the predecode signal BX0 is high, and a mode signal MD generated from the sequence control/voltage supply circuit 13 is high, the transistor 313 is turned OFF and the transistor 314 is turned ON, so that the voltage at the word line WL0 is $V_{PX}$. Note that $V_{PX}$ is $V_{PP}$ such as 12V during a write mode, $V_{PX}$ is $V_{CC}$ such as 5V during a read mode, and $V_{PX}$ is 0V during an erase mode.

Further, during a verifying mode for a lower limit value VL of threshold voltage, the mode signal MD is made low. As a result, the transistors 313, 323, . . . , are turned ON, and accordingly, the transistors 315, 325, . . . , are turned ON. Therefore, a voltage $V_{SX}$ corresponding to the lower limit value VL is applied to the word lines WL0, WL1, . . . . Note that, if the control is not in a verifying mode, the voltage $V_S$ $x$ is caused to be 0V.

In FIG. 3, which is a detailed circuit diagram of the redundancy row decoders 4-1 and 4-2, of FIG. 1, the redundancy row decoders 4-1 and 4-2, which have the same configuration, are provided for every eight redundancy word lines such as RWL0, RWL1, . . . , RWL7. For example, the redundancy row decoder 4-1 is comprised of an inverter 411 for a redundancy selection signal RS0 from the predecoder portion 11, eight transfer gate transistors 412, P-channel MOS transistors 413 and 414, and an N-channel MOS transistor 415. In this case, the transistors 414 and 415 form a CMOS inverter. Therefore, when the redundancy selection signal RS0 is low (inactive) , the output of the inverter 411 is high so that the redundancy memory cell array 4-1 is disabled. Contrary to this, when the redundancy selection signal RS0 is high (active) the output of the inverter 411 is low. Also, one of the predecode signals BX0, BX1, . . . , BX7 is made high. For example, if the predecode signal BX0 is high and the mode signal MD is high, the transistor 413 is turned OFF and the transistor 414 is turned ON, so that the voltage at the redundancy word line RWL0 is $V_{PX}$.

Further, during a verifying mode for a lower limit value VL of threshold voltage, the mode signal MD is made low.

As a result, the transistor 413 is turned ON, and accordingly, the transistor 415 is turned ON. Therefore a voltage $V_{sx}$ corresponding to the lower limit value VL is applied to the redundancy word lines RWL0, RWL1, . . . .

Figure 4:
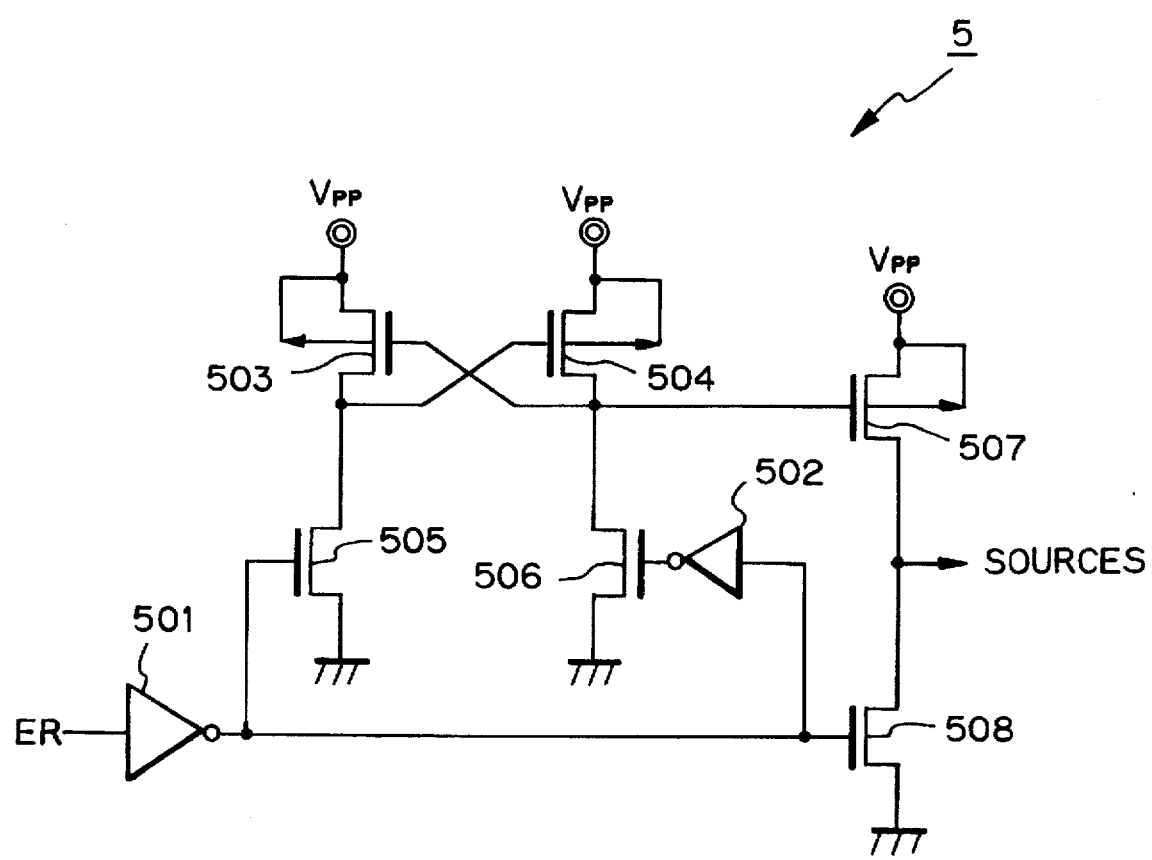
FIG. 4 is a detailed circuit diagram of the erase circuit of FIG. 1.

In FIG. 4, which is a detailed circuit diagram of the erase circuit 5 of FIG. 1, an erase signal ER is supplied from the sequence control/power supply circuit 13 via inverters 501 and 502 to a flip-flop formed by P-channel MOS transistors 503 and 504 and N-channel MOS transistors 505 and 506. The flip-flop is powered by the power supply voltage $V_{PP}$. Also, a P-channel MOS transistor 507 and an N-channel MOS transistor 508 are connected in series and are powered by the power supply voltage $V_{PP}$. The gate of the P-channel MOS transistor 507 is controlled by the output voltage of the flip-flop, while the gate of the N-channel MOS transistor 508 is controlled by an inverted signal of the erase signal ER. During an erase mode (ER="1"), the output voltage of the inverter 501 is low (=0V), so that the transistor 508 is turned OFF, and the output voltage of the flip-flop is also low, so that the transistor 507 is turned ON. As a result, the voltages of the sources are $V_{PP}$. Contrary to this, during a non-erase mode (ER="0"), the output voltage of the inverter 501 is high (=$V_{CC}$), so that the transistor 508 is turned ON, and the output voltage of the flip-flop is high (=$V_{PP}$), so that the transistor 507 is turned OFF. As a result, the voltages of the sources are 0V.

Figure 5:
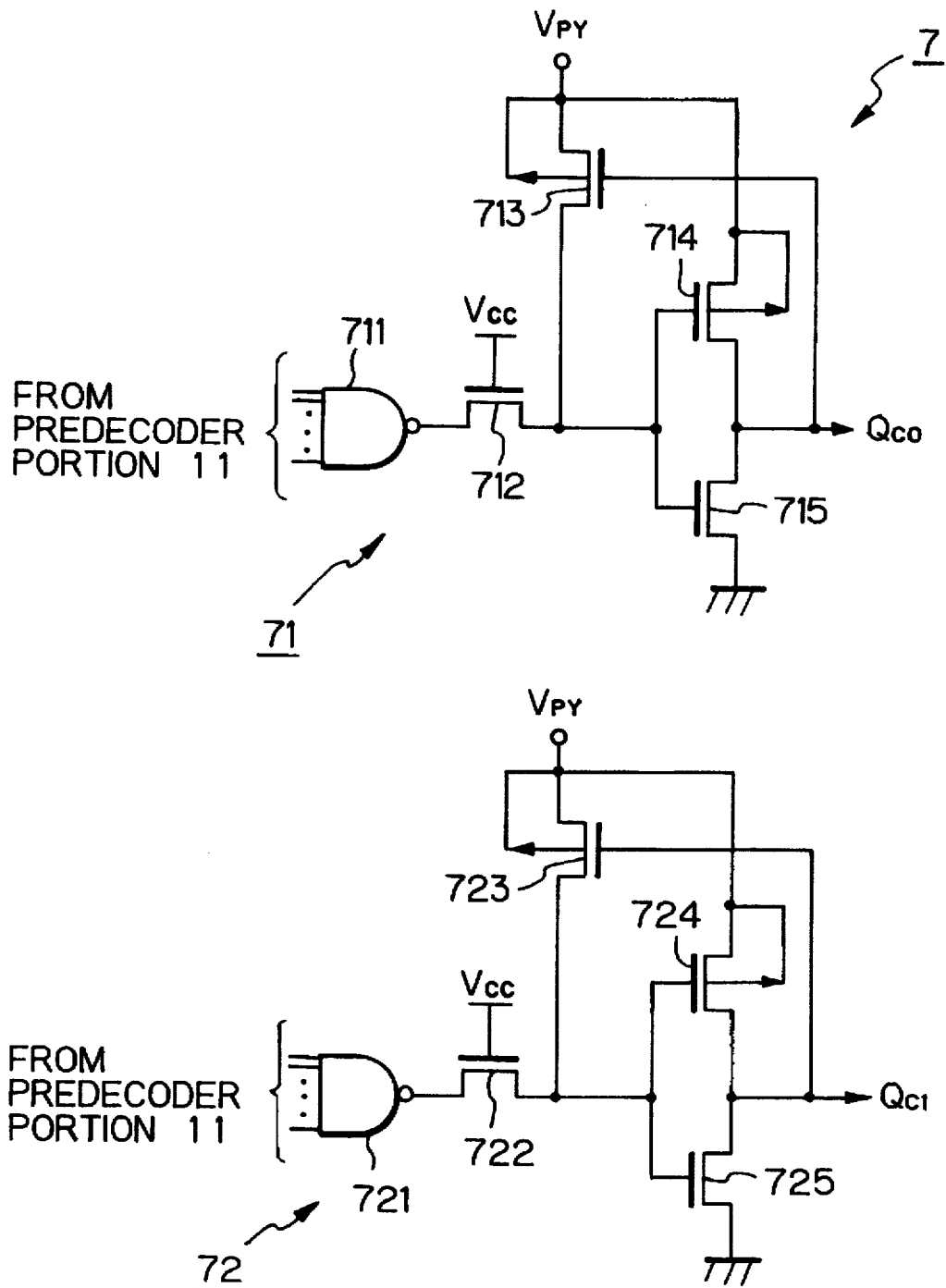
FIG. 5 is a detailed circuit diagram of the column decoder of FIG. 1.

In FIG. 5, which is a detailed circuit diagram of the column decoder 7 of FIG. 1, circuits 71, 72, . . . , which have the same configuration, are provided for the column selection transistors $Q_{c0}$, $Q_{c1}$, . . . . For example, the circuit 31 is comprised of a NAND circuit 711 for receiving address signals from the predecoder portion 11, a transistor 712, P-channel MOS transistors 713 and 714 and an N-channel MOS transistor 715. In this case, the transistors 714 and 715 form a CMOS inverter. Therefore, only when the output voltage of the NAND circuit 711 is low (=0V), is the transistor 714 turned ON so that the voltage at the gate of the column selection transistor $Q_{c0}$ is $V_{PP}$. In this case, the transistor 713 is turned OFF. Otherwise, when output voltage of the NAND circuit 711 is high, the transistor 715 is turned ON so that the voltage at the gate of the column selection transistor $Q_{c0}$ is 0V. In this case, the transistor 713 is turned ON.

Figure 6:
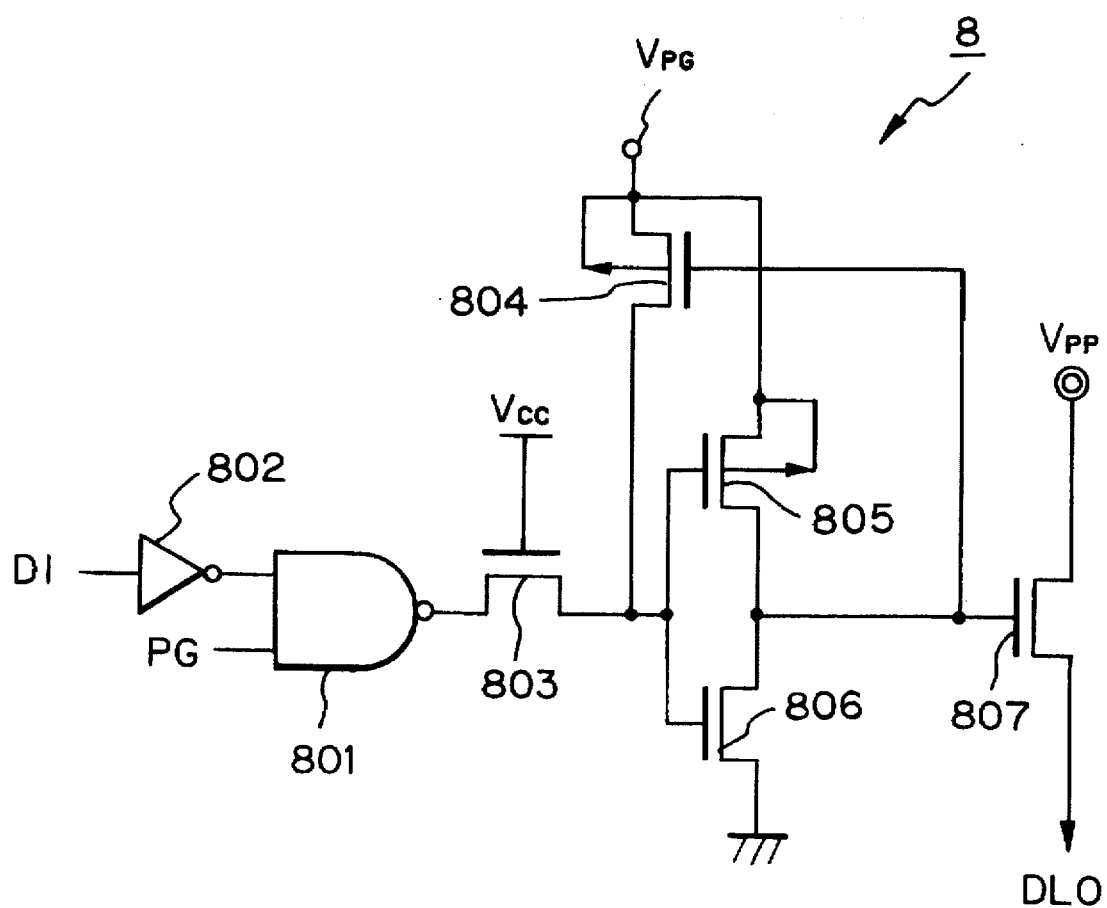
FIG. 6 is a detailed circuit diagram of the write circuit of FIG. 1.

In FIG. 6, which is a detailed circuit diagram of the write circuit 8 of FIG. 1, the write circuit 8 includes a NAND circuit 801 for receiving input data DI via an inverter 802 and a program signal PG from the sequence control/power supply circuit 13. Also, the write circuit 8 includes a transfer gate transistor 803, P-channel MOS transistors 804 and 805, and an N-channel MOS transistor 806. In this case, the transistors 805 and 806 form a CMOS inverter, whose output drives an N-channel MOS transistor 807. In a write mode (PG="1"), the NAND circuit 801 passes the input data DI therethrough, so that the output of the CMOS inverter is high (=$V_{PG}$) or low (=0V) in accordance with the input data DI. Thus, the voltage at the digit line DL0 is pulled up to $V_{PP}$. Conversely, in a read mode (PG="0"), the NAND circuit 801 is disabled, thus prohibiting the transition of the input data DI therethrough.

Figure 7:
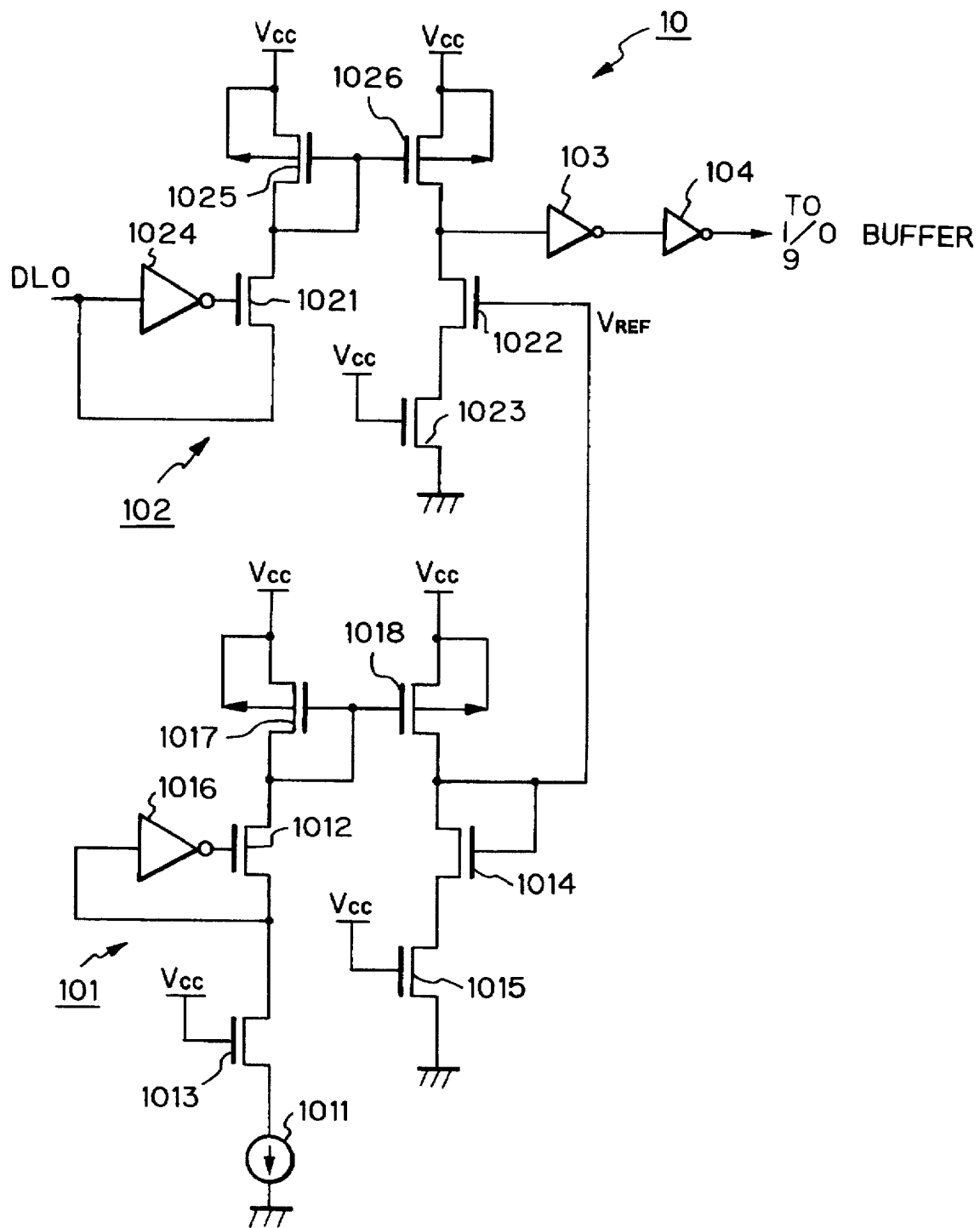
FIG. 7 is a detailed circuit diagram of the sense amplifier of FIG. 1.

In FIG. 7, which is a detailed circuit diagram of the sense amplifier 10 of FIG. 1, the sense amplifier 10 includes a reference voltage generating circuit 101 and a comparator 102. The reference voltage generating circuit 101 is comprised of a variable constant current source 1011, N-channel MOS transistors 1012, 1013, 1014 and 1015, an inverter 1016, and P-channel MOS transistors 1017 and 1018 forming a mirror circuit. In the reference voltage generating circuit 101, a current determined by the current source 1011 flows through a path formed by the elements 1017, 1012 and 1013, and the same current also flows through the elements 1018, 1014 and 1015, thus generating a reference voltage $V_{REF}$.

The comparator 102 is comprised of N-channel MOS transistors 1021, 1022 and 1023 corresponding to the transistors 1012, 1014 and 1015, respectively, an inverter 1024 corresponding to the inverter 1016, and P-channel MOS transistors 1025 and 1026 corresponding to the transistors 1017 and 1018, respectively. Therefore, if the voltage at the digit line DL0 is low, a current flows through the transistors 1021 and 1025 to pull up the voltage at an input of an inverter 103. Conversely, if the voltage at the digit line DL0 is high, a current hardly flows through the transistors 1021 and 1025 to pull down the voltage at the input of the inverter 103. Thus, the output of the inverter 103 is supplied via an inverter 104 to the input/output buffer 9. Note that the sizes of the transistors 1014 and 1022 are adjusted to obtain a predetermined resistance ratio therebetween.

Figure 8:
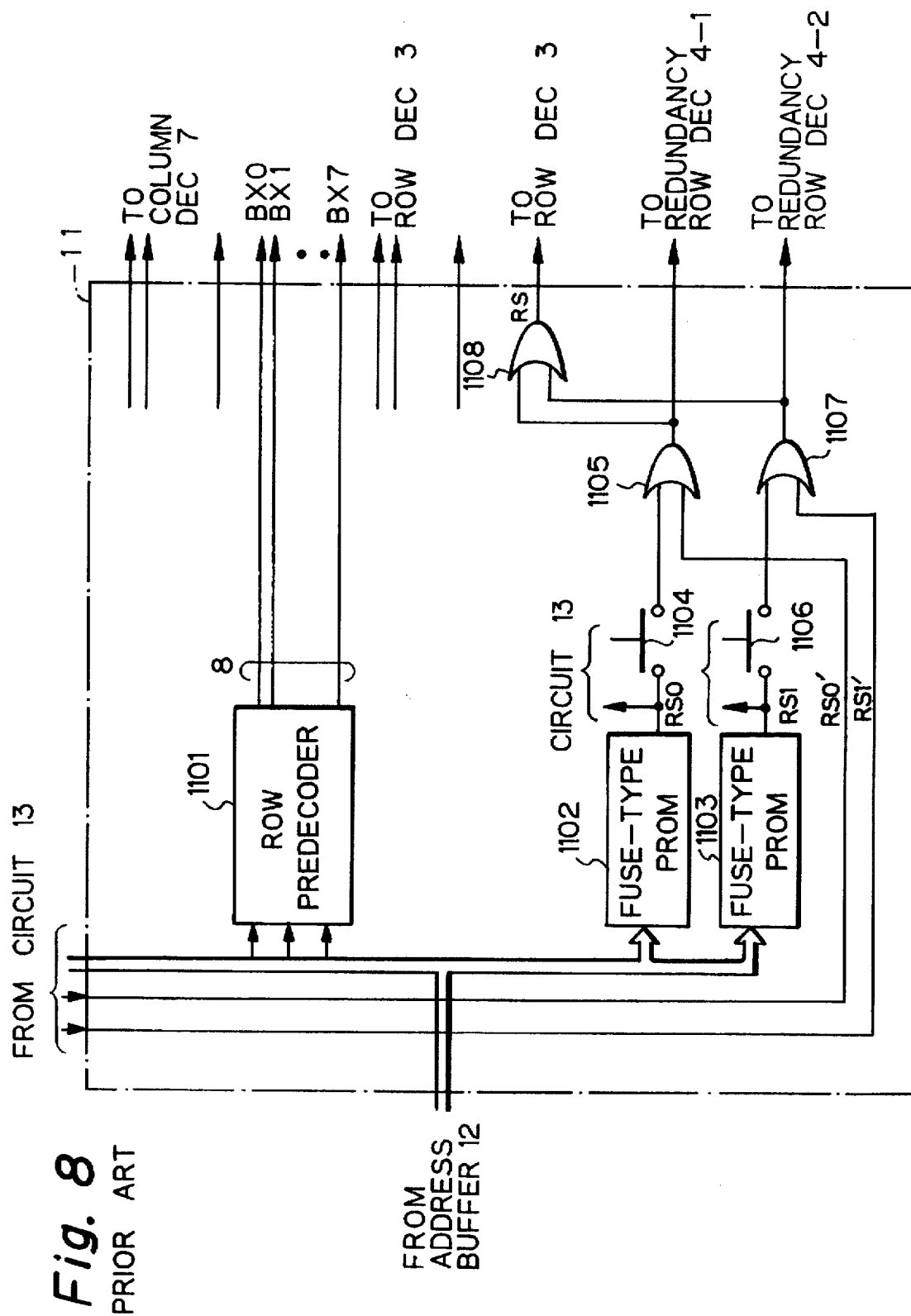
FIG. 8 is a detailed circuit diagram of the predecoder portion of FIG. 1.

In FIG. 8, which is a partly-detailed circuit diagram of the predecoder portion 11 of FIG. 1, a row predecoder 1101 is provided for receiving three lower bits of a row address to generate the predecode signals BX0, BX1, . . . , BX7 and transmit them to the row decoder 3 and the redundancy row decoders 4-1 and 4-2.

Also, fuse-type programmable read-only memories (PROMs) 1102 and 1103 are provided for storing row addresses defined by the upper bits of the row address except for the above-mentioned three lower bits. That is, when one or more memory cells are determined to be defective in the normal memory cell array 1, row addresses indicating such defective memory cells are written into the fuse-type PROMs 1102 and 1103. As a result, when a read or write address coincides with one of the addresses stored in the fuse-type PROMs 1102 and 1103, the fuse-type PROM 1102 or 1103 generates a redundancy selection signal RS0 or RS1, thus replacing rows of the memory cells in the normal memory cell array 1 including the defective memory cell with the redundancy memory cell array 2-1 or 2-2. Thus, the defective memory cells are alleviated.

The redundancy selection signal RS0 generated from the fuse-type PROM 1102 is transmitted via a switch 1104 and an OR circuit 1105 to the redundancy row decoder 4-1. Similarly, the redundancy selection signal RS1 generated from the fuse-type PROM 1103 is transmitted via a switch 1106 and an OR circuit 1107 to the redundancy row decoder 4-2. Also, the redundancy selection signals RS0 and RS1 are transmitted via an OR circuit 1108 as the redundancy selection signal RS to the row decoder 3. That is, when at least one of the redundancy memory cell arrays 2-1 and 2-2 is selected, the row decoder 3 is disabled.

The switches 1104 and 1106 are controlled by the sequence control/power supply circuit 13. For example, even if the redundancy selection signal RS0 is generated from the fuse-type PROM 1102, the sequence control/power supply voltage 13 makes the switch 1104 open, so that the row of the memory cells including a defective memory cell can be selected in the normal memory cell array 1.

On the other hand, redundancy selection signals RS0' and RS1' are supplied from the sequence control/power supply circuit 13 via the OR circuits 1105 and 1107. For example, even if the redundancy selection signal RS0 is not generated from the fuse-type PROM 1102, the sequence control/power supply circuit 13 generates the redundancy selection signal RS0', so that the redundancy memory cell array 2-1 can be selected.

Figure 9:
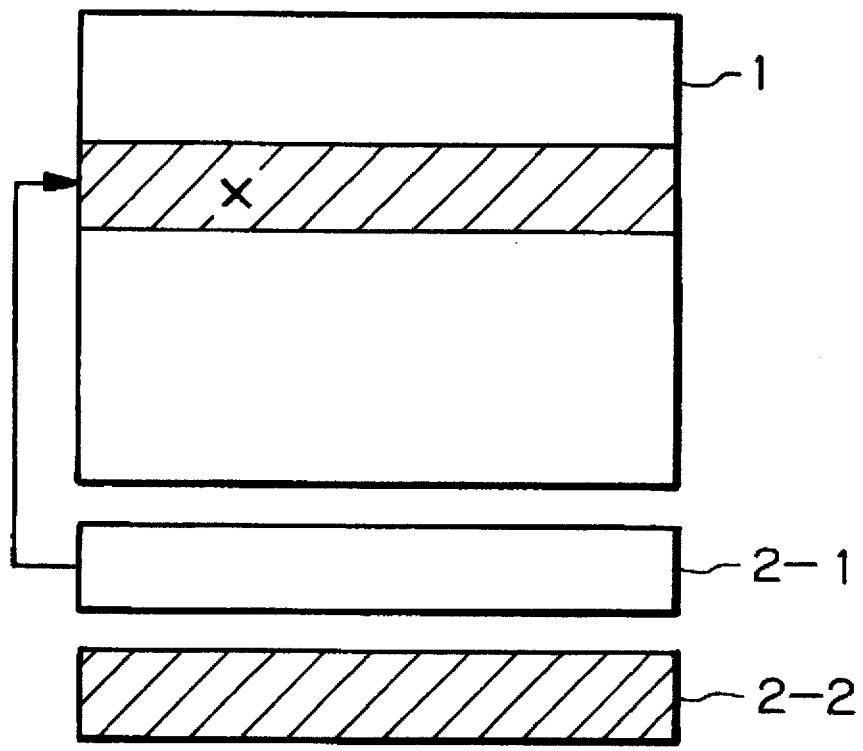
FIG. 9 is a diagram for explaining used memory cells and unused memory cells of FIG. 1.

In FIG. 9, which illustrates a state of the normal memory cell array 1 and the redundancy memory cell arrays 2-1 and 2-2 of FIG. 1, when a defective memory cell as indicated by X is found in the normal memory cell array 1, rows of memory cells of the normal memory cell array 1 including the defective memory cell are replaced by the redundancy memory cell array 2-1. In this case, the normal memory cell array 1 except for a shaded portion thereof and the redundancy memory cell array 2-1 are used, while the shaded portion of the normal memory cell array 1 and the redundancy memory cell array 2-2 are unused.

Figure 10:
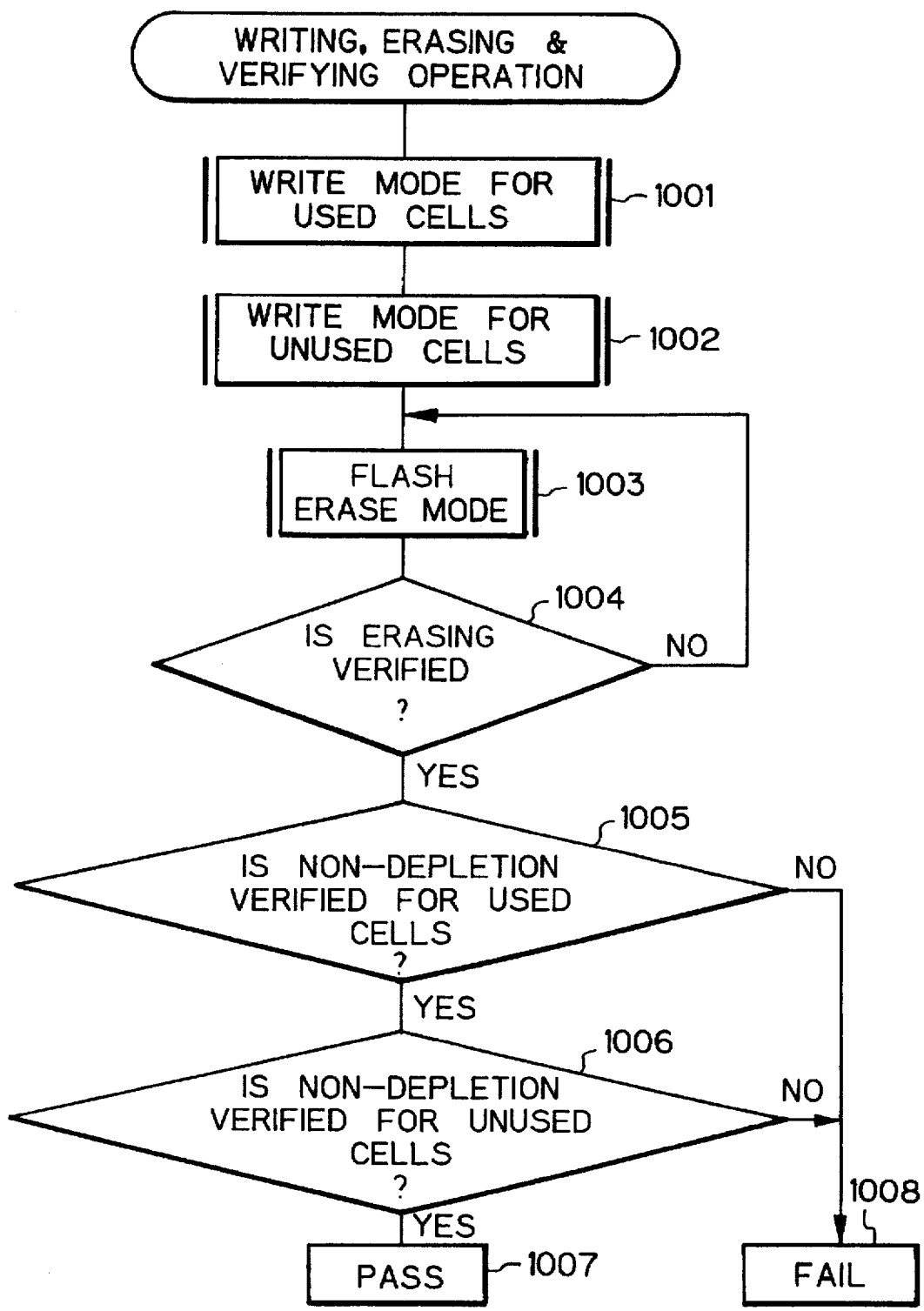
FIG. 10 a flowchart for showing a prior art method for writing, erasing and verifying a nonvolatile memory device.

A prior art method for writing, erasing and verifying the memory cells of FIG. 1 is explained next with reference to FIG. 10 as well as FIGS. 9 and 11A, 11B, 11C and 11D. Note that FIG. 10 is a routine carried out by the sequence control/power supply circuit 13. Also, assume that the sequence control/power supply circuit 13 recognizes the contents of the fuse-type PROMs 1102 and 1103.

First, at step 1001, a write operation is performed upon the used memory cells as shown in FIG. 9. In this case, the sequence control/power supply circuit 13 closes the switches 1104 and 1106, and does not generate the redundancy selection signals RS0' and RS1'. Also, the sequence control/ power supply circuit 13 generates the program signal PG to activate the write circuit 8 for data "0". Then, an address is sequentially incremented and transmitted to the predecoder portion 11. As a result, as indicated by X1 in FIG. 11A, the threshold voltages of the used cells are made high.

Next, at step 1002, a write operation is also performed upon the unused memory cells as shown in FIG. 9. In this case, the sequence control/power supply circuit 13 opens the switch 1104 and closes the switch 1106. Also, the sequence control/power supply circuit 13 generates the program signal PG to activate the write circuit 8 for data "0". Then, the address stored in the fuse-type PROM 1102 is generated and transmitted to the predecoder portion 11. As a result, data "0" is written into the row of the normal memory cell array 1 corresponding to the address stored in the fuse-type PROM 102. Then, the redundancy selection signal RS1' is generated and transmitted to the predecoder portion 11. As a result, data "0" is written into the redundancy memory cell array 2-2 as indicated by Y1 in FIG. 11A, the threshold voltages of the unused memory cells are also made high.

Next, at step 1003, a flash erase operation is performed upon the used memory cells and the unused memory cells. That is, the sequence control/voltage supply circuit 13 generates the erase signal ER for a predetermined short time period and transmits it to the erase circuit 5. Therefore, the high power supply voltage $V_{PP}$ is supplied to the sources of all the memory cells, while all the word lines WL0, WL1, . . . , WLm and the redundancy word lines RWL0, RWL1, . . . , RWL7, RWL8, . . . , RWL15 are grounded. As a result, all the used memory cells as well as all the unused memory cells are erased. Thus, the threshold voltages of the used memory cells are made low as indicated by X2 in FIG. 11A, and also, the threshold voltages of the unused memory cells are made low as indicated by Y2 in FIG. 11A.

Next, at step 1004, a verifying operation is performed upon the used memory cells, to determine whether or not the threshold voltages of the used memory cells are lower than an upper limit value VU which is slightly lower than a read voltage at the word lines WL0, WL1, . . . WLm, and the redundancy word lines RWL0, RWL1, . . . , RWL15. For example, the upper limit value VU is 3.0V to 3.5V. That is, the sequence control/power supply circuit 13 closes the switches 1104 and 1106, and does not generate the redundancy selection signals RS0' and RS1' and the program signal PG. Also, the sequence control/power supply circuit 13 sets VU in the voltage $V_{P\ X}$. Then, an address is sequentially incremented and transmitted to the predecoder portion 11, so as to determine whether or not the threshold voltages of the used memory cells are lower than the upper limit value VU in accordance with the output of the sense amplifier 10.

At step 1004, when at least one of the threshold voltages of the used memory cells is not lower than the upper limit value VU, the control returns to step 1003, thus repeating the operations at steps 1003 and 1004.

At step 1004, when all the threshold voltages of the used memory cells are lower than the upper limit value VU, the control proceeds to step 1005.

At step 1005, a verifying operation is performed upon all the used memory cells, to determine whether or not the threshold voltages of the used memory cells are higher than a lower limit value VL which is slightly higher than 0V, for example, 0.3V. That is, at step 1005, it is determined whether or not the used memory cells are not of a depletion type. In this case, the sequence control/power supply circuit 13 closes the switches 1104 and 1106, and does not generate the redundancy selection signals RS0' and RS1'. Also, the sequence control power supply circuit 13 sets VL in the voltage $V_{s x}$, while the mode signal MD is made high to turn OFF the transistors 313, 323, . . . , 413 and 423. Then, an address is sequentially generated and transmitted to the predecoder portion 11, so as to determine whether or not the threshold voltages of the used memory cells are higher the lower limit value VL in accordance with the output of the sense amplifier 10.

At step 1005, when at least one of the used memory cells is not higher than the lower limit value VL, the control proceeds to step 1008 which determines that the device is failed. Otherwise, the control proceeds to step 1006.

At step 1006, a verifying operation is performed upon all the unused memory cells, to determine whether or not the threshold voltages of the unused memory cell are higher than the lower limit value VL. That is, at step 1006, it is determined whether or not the unused memory cells are not of a depletion type. In this case, the sequence control/power supply circuit 13 closes the switch 1104 and opens the switch 1106. Also, the sequence control power supply circuit 13 sets VL in the voltage $V_{S\ X}$, while the mode signal MD is made high to turn OFF the transistors 313, 323, . . . , 413 and 423. Then, the address stored in the fuse-type PROM 1102 is generated to the predecoder portion 11, so as to determine whether or not the unused memory cells of the normal memory cell array 1 are higher than the lower limit value VL in accordance with the output of the sense amplifier 10. Then, the redundancy selection signal RS1' is generated and transmitted to the predecoder portion 11, so as to determine whether or not the threshold voltages of the unused memory cells of the redundancy memory cell array 2-2 are higher the lower limit value VL in accordance with the output of the sense amplifier 10.

At step 1006, when at least one of the unused memory cells is not higher than the lower limit value VL, the control proceeds to step 1008 which determines that the device is failed. Otherwise, the control proceeds to step 1007 which determines that the device is passed.

Figure 11A:
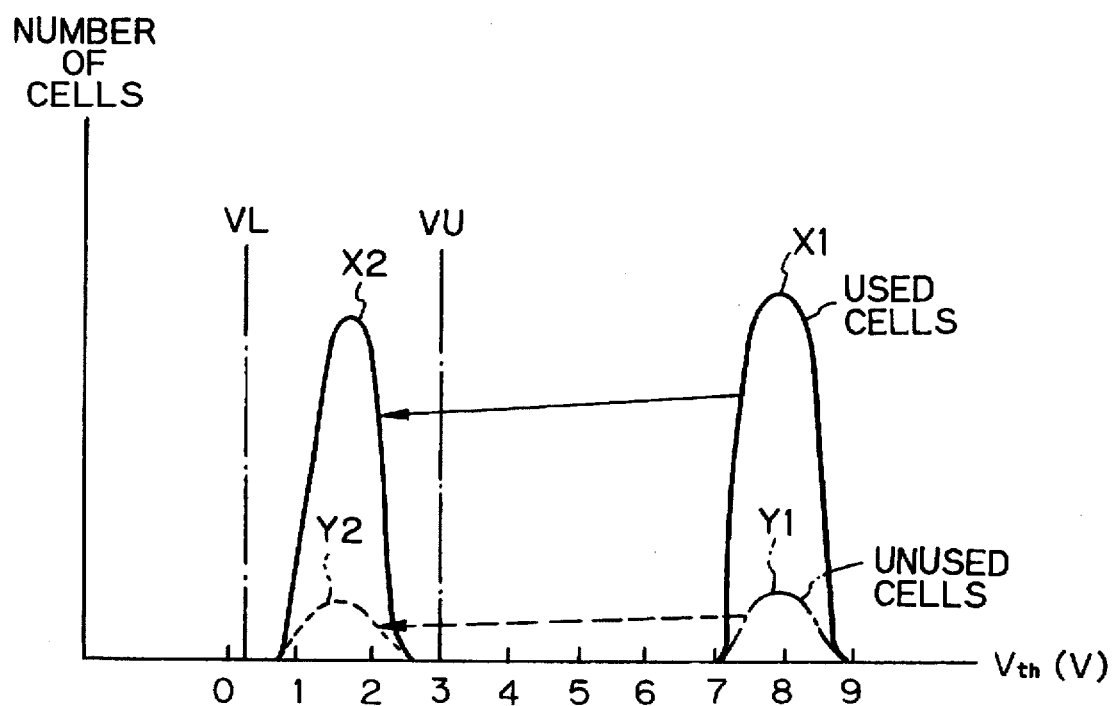
FIGS. 11A, 11B, 11C and 11D are graphs showing threshold voltage characteristics of memory cells obtained by the routine of FIG. 10.
Figure 11B:
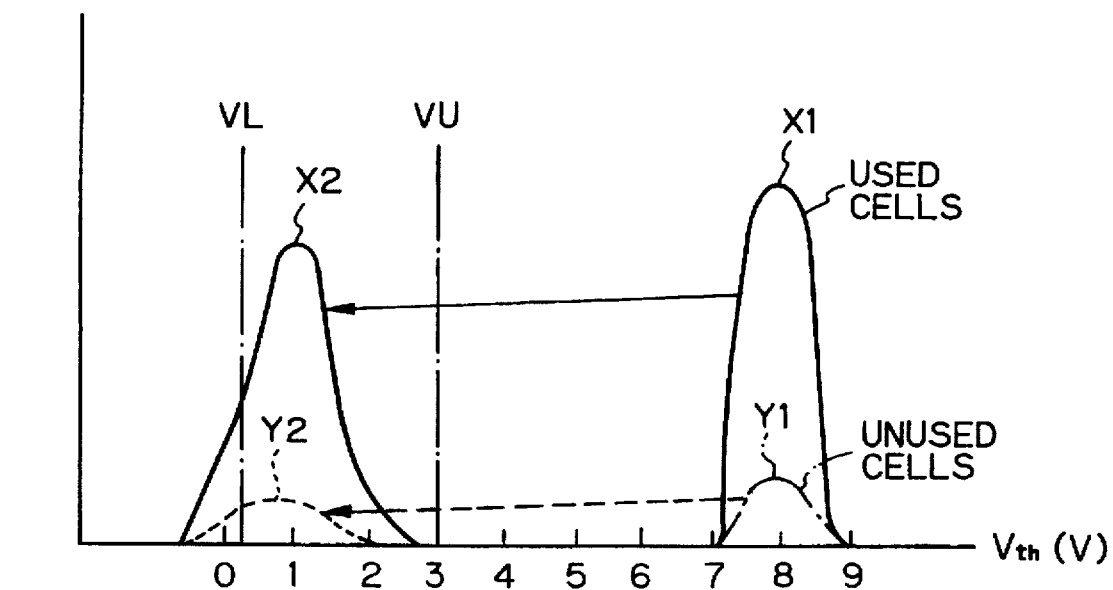
Figure 11C:
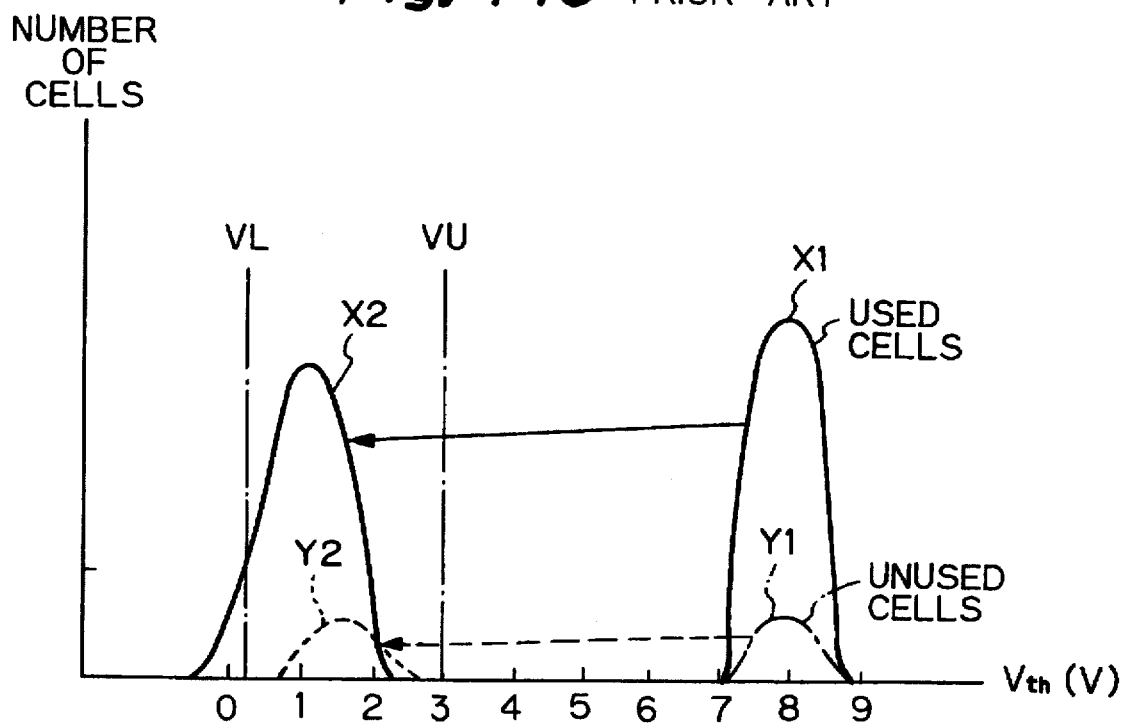
Figure 11D:
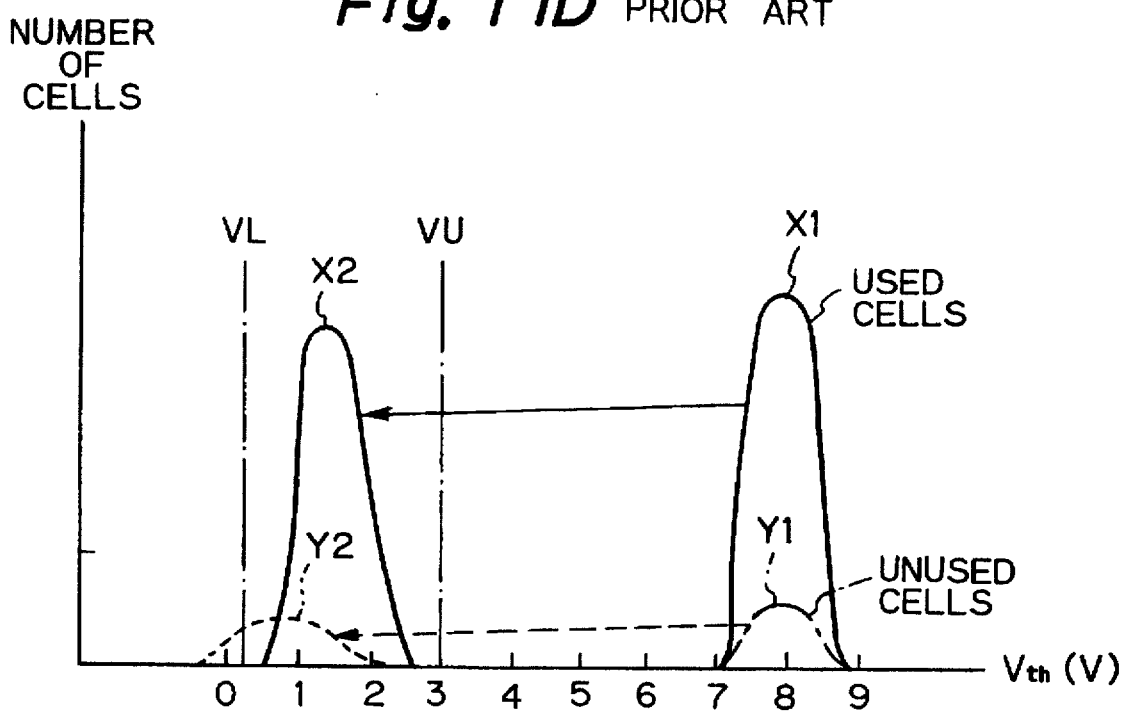

According to the routine of FIG. 10, when the determinations at steps 1005 and 1006 are both affirmative as shown in FIG. 11A, the device is determined to be passed. On the contrary, when the determinations at steps 1005 and 1006 are both negative as shown in FIG. 11B, when the determination at step 1005 is negative and the determination at step 1006 is affirmative as shown in FIG. 11C, or when the determination at step 1005 is affirmative and the determination at step 1006 is negative as shown in FIG. 11D, the device is determined to be failed.

Figure 12:
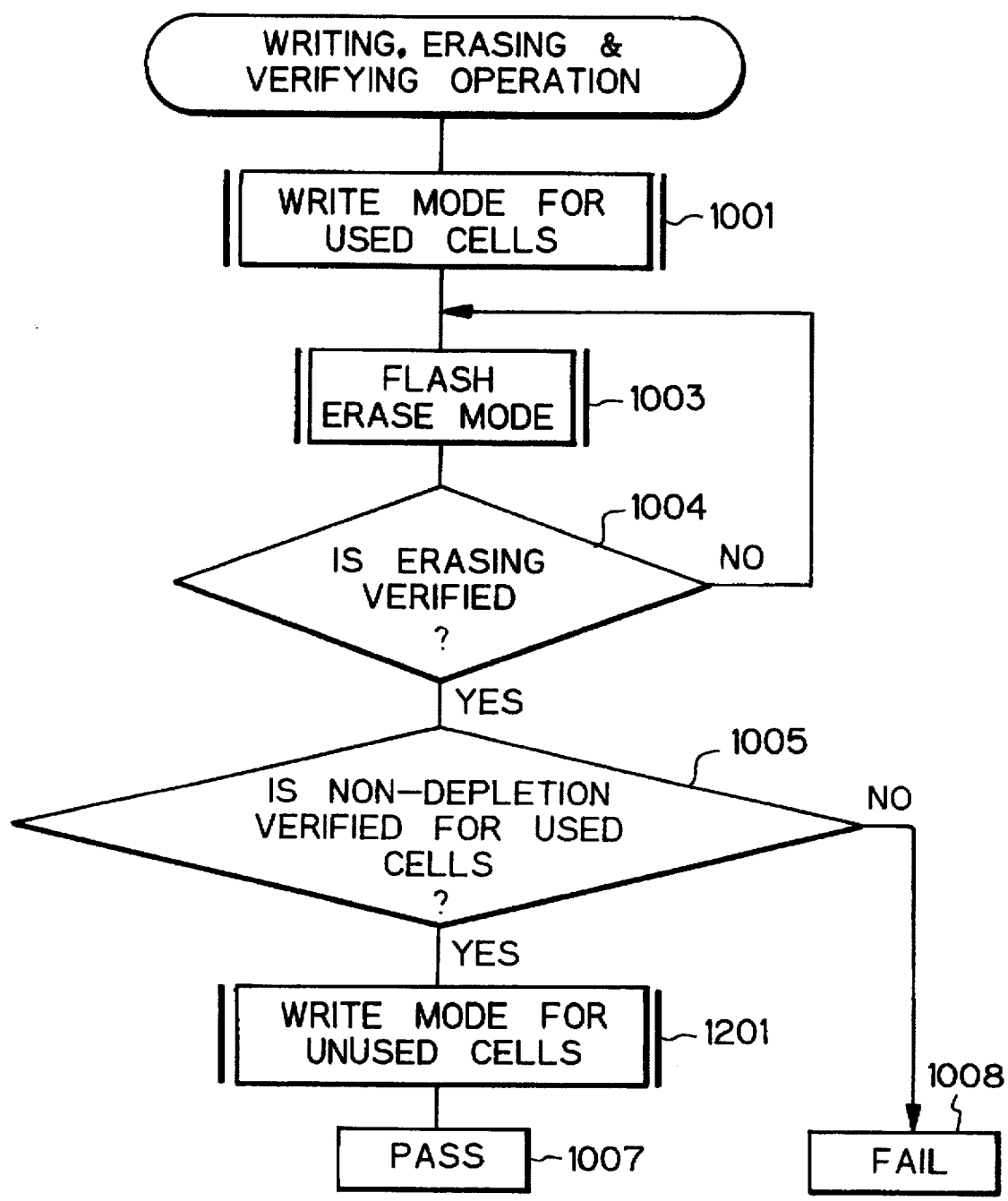
FIG. 12 is a flowchart for explaining a first embodiment of the method for writing, erasing and verifying a nonvolatile semiconductor memory device according to the present invention.

In FIG. 12, which illustrates a first embodiment of the present invention, step 1002 of FIG. 10 is deleted, and step 1201 is provided instead of step 1006 of FIG. 10.

First, at step 1001, a write operation is performed upon the used memory cells as shown in FIG. 9. In this case, the sequence control/power supply circuit 13 closes the switches 1104 and 1106, and does not generate the redundancy selection signals RS0' and RS1'. Also, the sequence control/power supply circuit 13 generates the program signal PG to activate the write circuit 8 for data "0". Then, an address is sequentially incremented and transmitted to the predecoder portion 11. As a result, as indicated by X1 in FIG. 13, the threshold voltages of the used cells are made high.

Figure 13:
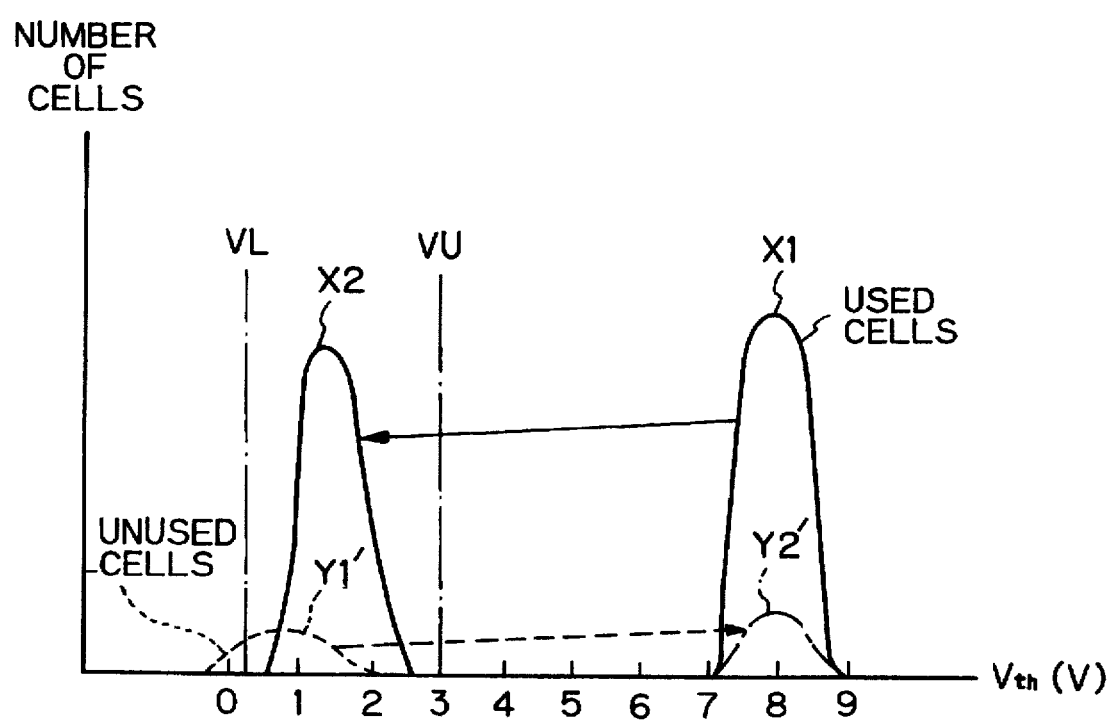
FIG. 13 is a graph showing threshold voltage characteristics of memory cells obtained by the routine of FIG. 12.

Next, at step 1003, a flash erase operation is performed upon the used memory cells and the unused memory cells. That is, the sequence control/voltage supply circuit 13 generates the erase signal ER for a predetermined short time period and transmits it to the erase circuit 5. Therefore, the high power supply voltage $V_{PP}$ is applied to the sources of all the memory cells, while all the word lines WL0, WL1, . . . , WLm and the redundancy word lines RWL0, RWL1, . . . , RWL7, RWL8, . . . , RWL15 are grounded. As a result, all the used memory cells as well as all the unused memory cells are erased. Thus, the threshold voltages of the used memory cells are made low as indicated by X2 in FIG. 13, and also, the threshold voltages of the unused memory cells are made low as indicated by Y1' in FIG. 13. In FIG. 13, assume that the used memory cells after the flash erase operation are not of a depletion type as indicated by X2 in FIG. 13, and some of the unused memory cells after the flash erase operation are of a depletion type as indicated by Y' in FIG. 13.

Next, at step 1004, a verifying operation is performed upon the used memory cells, to determine whether or not the threshold voltages of the used memory cells are lower than the upper limit value VU. That is, the sequence control/power supply circuit 13 closes the switches 1104 and 1106, and does not generate the redundancy selection signals RS0' and RS1' and the program signal PG. Also, the sequence control/power supply circuit 13 sets VU in the voltage $V_{px}$. Then, an address is sequentially incremented and transmitted to the predecoder portion 11, so as to determine whether or not the threshold voltages of the used memory cells are lower than the upper limit value VU in accordance with the output of the sense amplifier 10.

At step 1004, when at least one of the threshold voltages of the used memory cells is not lower than the upper limit value VU, the control returns to step 1003, thus repeating the operations at steps 1003 and 1004.

At step 1004, when all the threshold voltages of the used memory cells are lower than the upper limit value VU, the control proceeds to step 1005.

At step 1005, a verifying operation is performed upon all the used memory cells, to determine whether or not the threshold voltages of the used memory cells are higher than the lower limit value VL. That is, at step 1005, it is determined whether or not the used memory cells are not of a depletion type. In this case, the sequence control/power supply circuit 13 closes the switches 1104 and 1106, and does not generate the redundancy selection signals RS0' and RS1'. Also, the sequence control power supply circuit 13 sets VL in the voltage $V_{sx}$, while the mode signal MD is made high to turn OFF the transistors 313, 323, . . . , 413 and 423. Then, an address is sequentially generated and transmitted to the predecoder portion 11, so as to determine whether or not the threshold voltages of the used memory cells are higher the lower limit value VL in accordance with the output of the sense amplifier 10.

At step 1005, when at least one of the used memory cells is not higher than the lower limit value VL, the control proceeds to step 1008 which determines that the device is failed. Otherwise, the control proceeds to step 1201.

At step 1201, a write operation is also performed upon the unused memory cells as shown in FIG. 9. In this case, the sequence control/power supply circuit 13 opens the switch 1104 and closes the switch 1106. Also, the sequence control/power supply circuit 13 generates the program signal PG to activate the write circuit 8 for data "0". Then, the address stored in the fuse-type PROM 1102 is generated and transmitted to the predecoder portion 11. As a result, data "0" is written into the row of the normal memory cell array 1 corresponding to the address stored in the fuse-type PROM 1102. Then, the redundancy selection signal RS1' is generated and transmitted to the predecoder portion 11. As a result, data "0" is written into the redundancy memory cell array 2-2 as indicated by Y2' in FIG. 13, the threshold voltages of the unused memory cell are also made high. Then, the control proceeds to step 1007 which determines that the device is passed.

According to the first embodiment as illustrated in FIG. 12, even when the threshold voltages of the unused memory cells are over-erased as indicated by Y1' in FIG. 13, the over-erased unused memory cells can be corrected by the write operation at step 1201. Thus, the device which is determined to be failed in the prior art method as shown in FIG. 11D can be determined to be passed.

Figure 14:
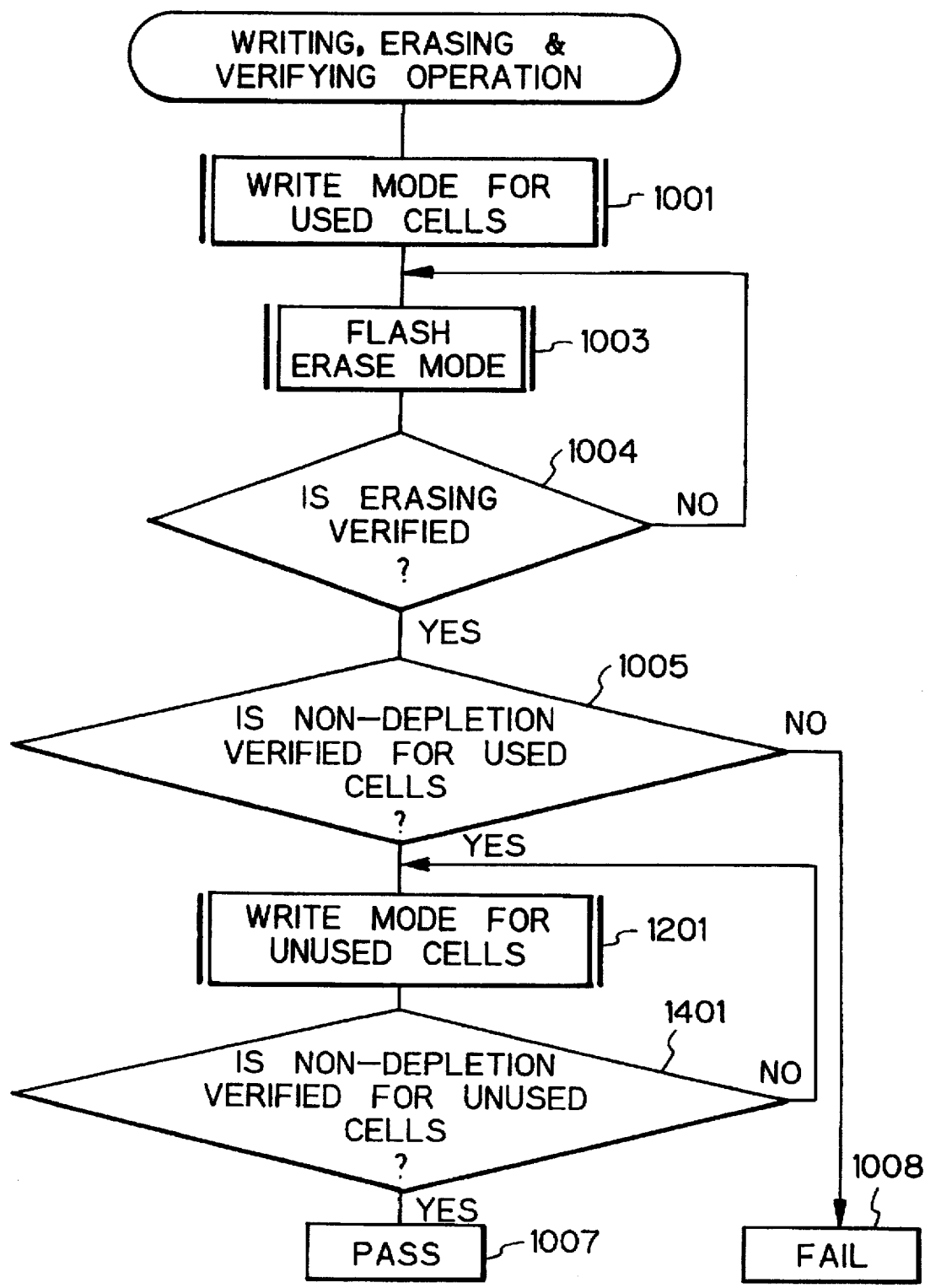
FIG. 14 is a flowchart for explaining a second embodiment of the method for writing, erasing and verifying a nonvolatile semiconductor memory device according to the present invention.
Figure 15:
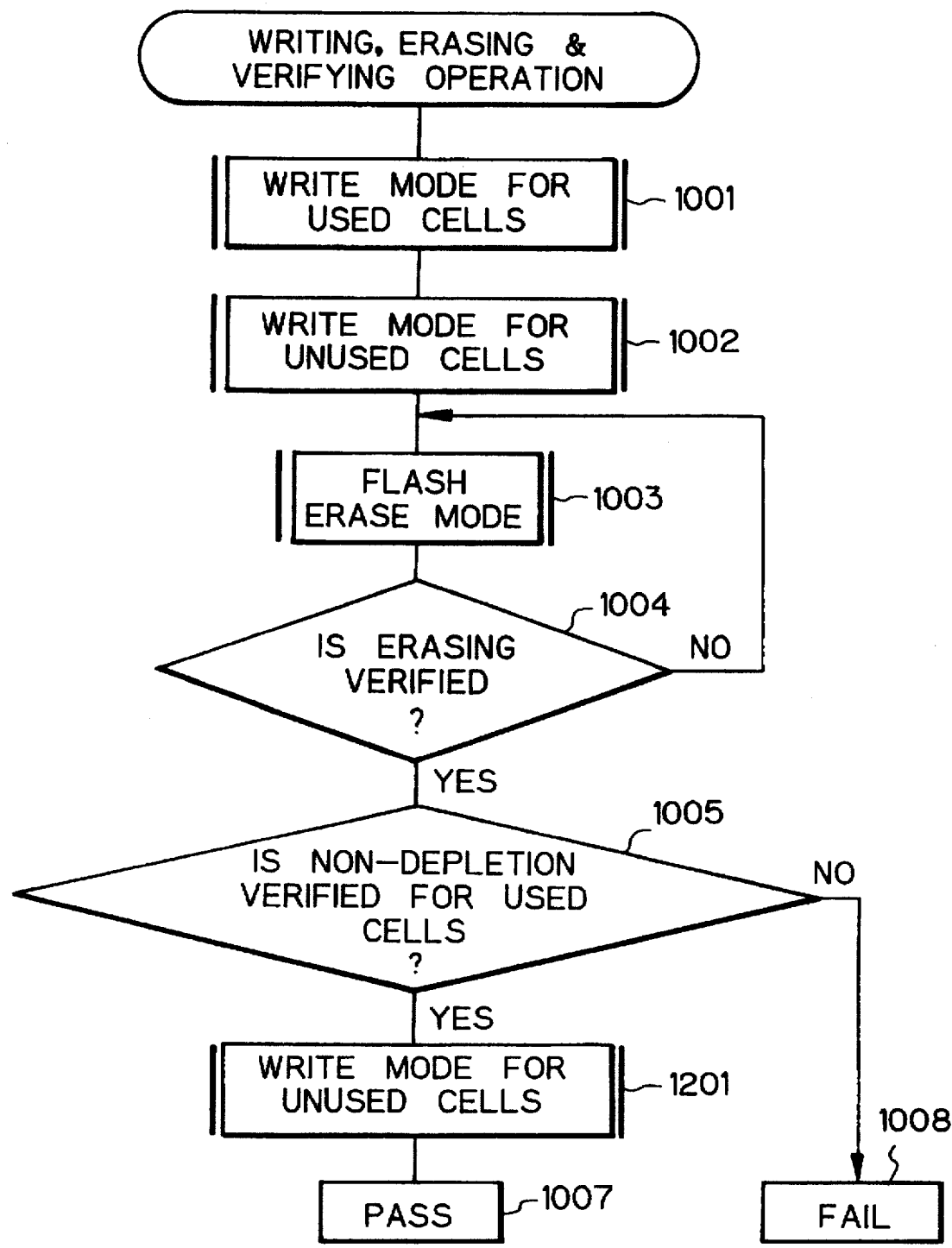
FIG. 15 is a flowchart for explaining a third embodiment of the method for writing, erasing and verifying a nonvolatile semiconductor memory device according to the present invention.

In FIG. 14, which illustrates a second embodiment of the present invention, step 1401 is added to the routine of FIG. 12. That is, at step 1401, a verifying operation is performed upon all the used memory cells, to determine whether or not the threshold voltages of the used memory cells are higher than a lower limit value VL which is slightly higher than 0V, for example, 0.3V. That is, at step 1401, it is determined whether or not the used memory cells are not of a depletion type. In this case, the sequence control/power supply circuit 13 closes the switches 1104 and 1106, and does not generate the redundancy selection signals RS0' and RS1'. Also, the sequence control power supply circuit 13 sets VL in the voltage $V_{sx}$, while the mode signal MD is made high to turn OFF the transistors 313, 323, . . . , 413 and 423. Then, an address is sequentially generated and transmitted to the predecoder portion 11, so as to determine whether or not the threshold voltages of the used memory cells are higher than the lower limit value VL in accordance with the output of the sense amplifier 10.

At step 1401, when at least one of the used memory cells is not higher than the lower limit value VL, the control returns to step 1201. Thus, the write operation at step 1201 is repeated until the threshold voltages of all the unsed memory cells are not of a depletion type. Then, the control proceeds to step 1007 which determines that the device is passed.

According to the second embodiment as illustrated in FIG. 14, the over-erased unused memory cells can be completely corrected.

Figure 16:
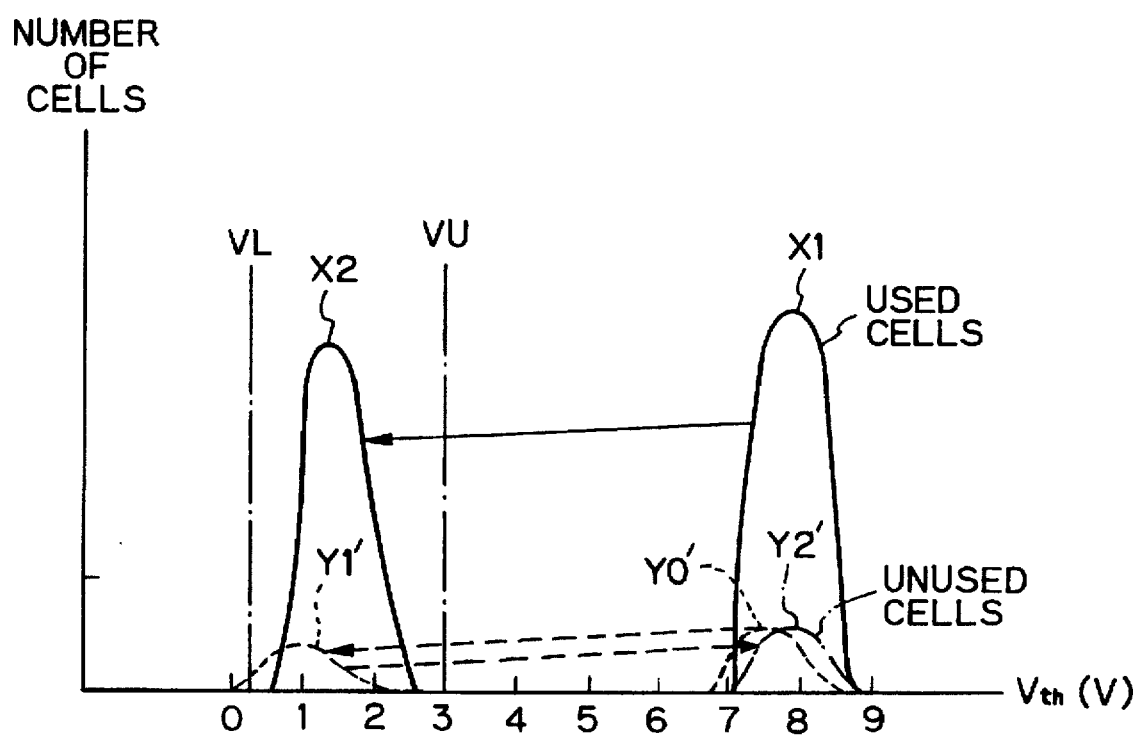
FIG. 16 is a graph showing threshold voltage characteristics of memory cells obtained by the routine of FIG. 15.

In FIG. 16, which illustrates a third embodiment of the present invention, step 1002 is added to the routine of FIG.

12. That is, before the flash erase operation, a write operation is also performed upon the unused memory cells. As a result, the threshold voltages of the unused memory cells are made high as indicated by Y0' in FIG. 16. This enhances the threshold voltages of the unused memory cells after the write operation at step 1201 is performed. Therefore, the threshold voltages of the unused memory cells are surely made higher as indicated by Y2' in FIG. 16.

Figure 17:
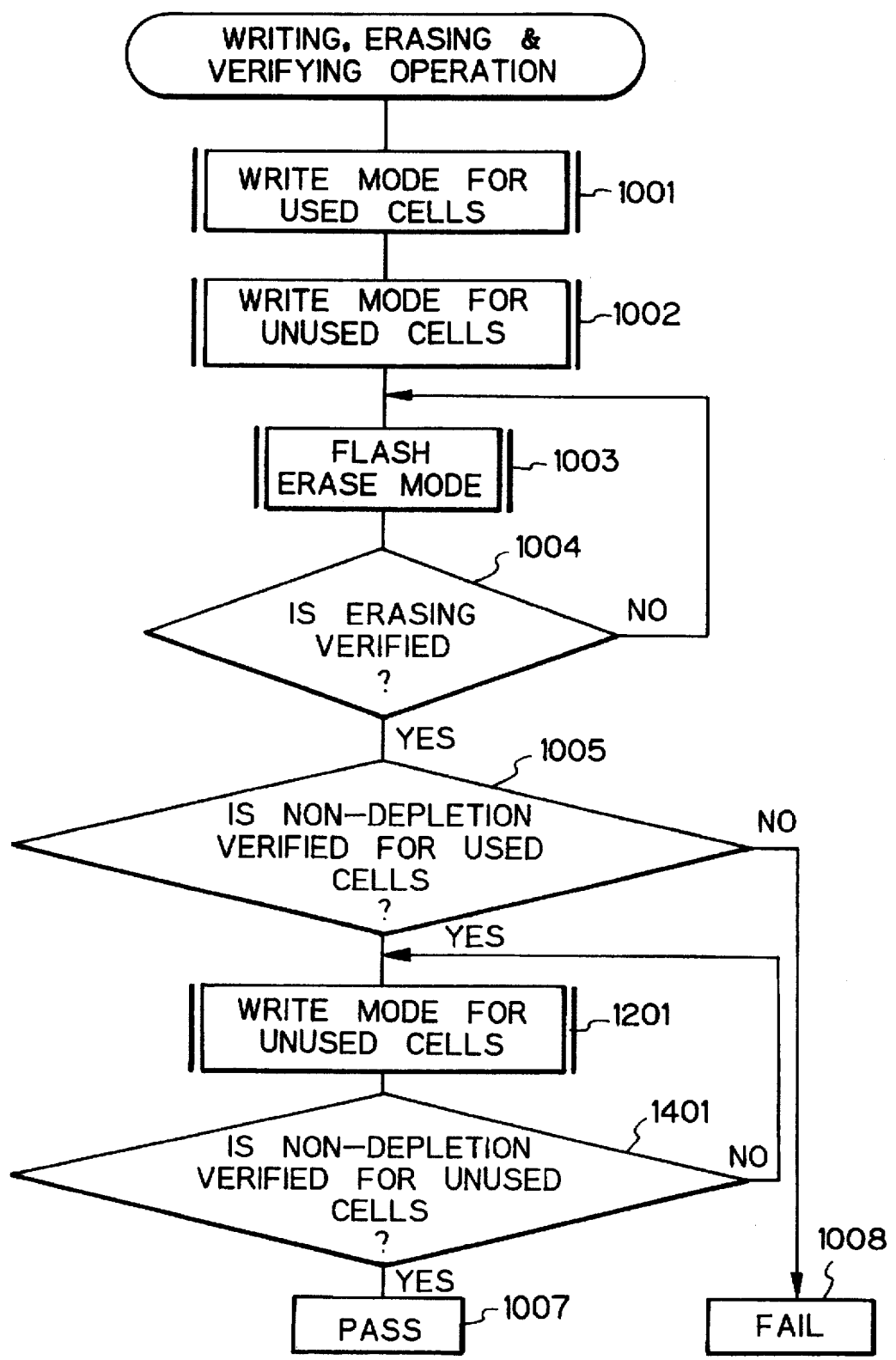
FIG. 17 is a flowchart for explaining a fourth embodiment of the method for writing, erasing and verifying a nonvolatile semiconductor memory device according to the present invention.

In FIG. 17, which illustrates a fourth embodiment of the present invention, the second embodiment is combined with the third embodiment, i.e., step 1002 is added to the routine of FIG. 14. That is, before the flash erase operation, a write operation is also performed upon the unused memory cells. As a result, the threshold voltages of the unused memory cells are made high. This reduces the number of operations at steps 1201 and 1401, thus reducing the entire time.

Actually, the generation of defective memory cells is often due to a short-circuit between two adjacent word lines. Therefore, even when a write operation is performed upon the memory cells connected to one of the short-circuited word lines, the power supply voltage $V_{PP}$ applied to this one of the short-circuited word lines is reduced by the other of the short-circuited word lines, so that it is impossible to carry out this write operation. In order to surely perform a write operation upon the defective memory cells due to the short-circuit of two adjacent word lines, the two adjacent word lines are simultaneously selected. For this purpose, the predecoder 1101 of FIG. 11 can be constructed as illustrated in FIG. 18.

Figure 18:
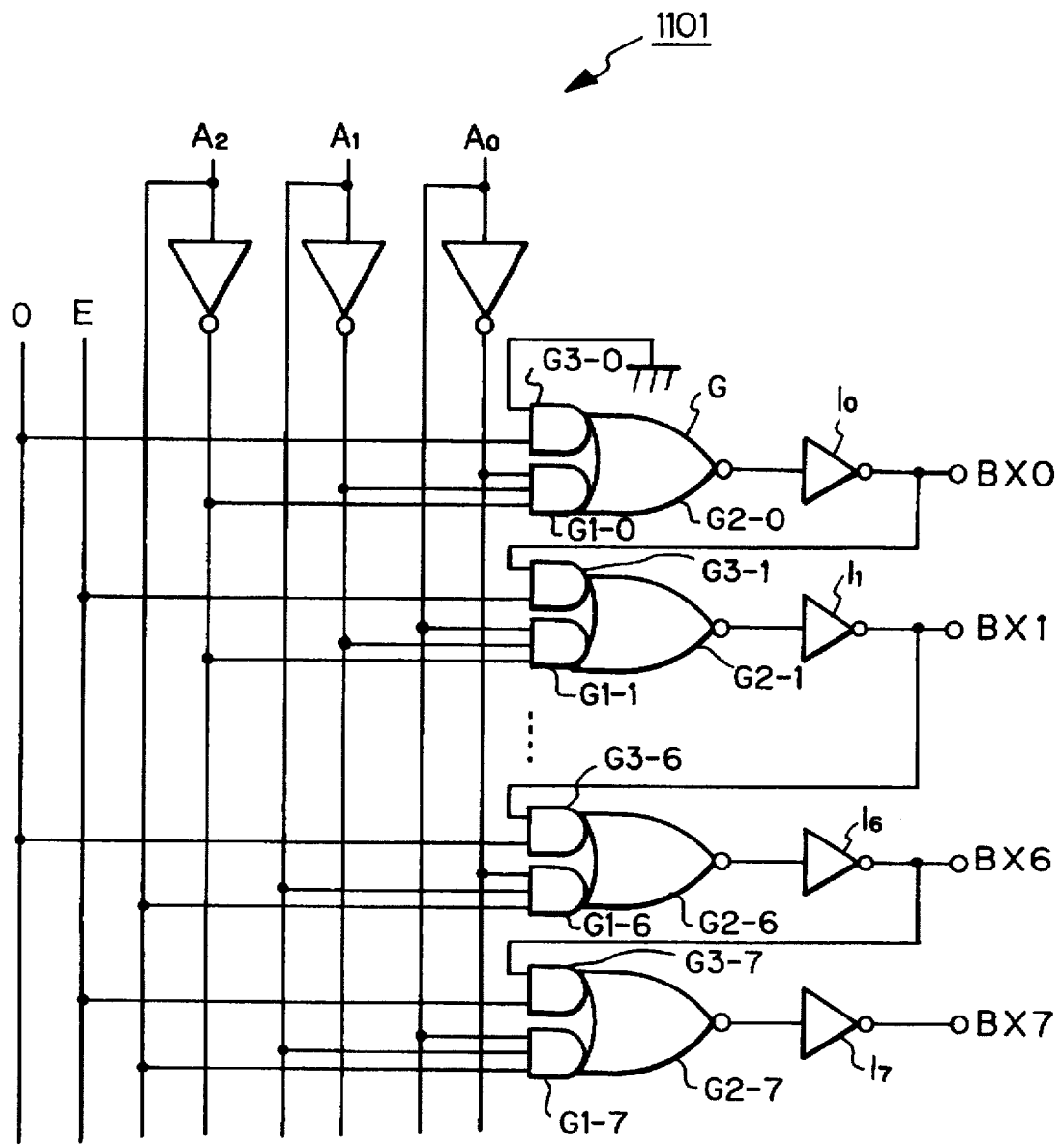
FIG. 18 is a circuit diagram of a predecoder according to the present invention.

In FIG. 18, AND circuits G1-0, G1-1, ..., G1-6 and G1-7 for receiving row address signals $A_0$, $A_1$ and $A_2$ and their inverted signals are combined with NOR circuits G2-0, G2-1, ..., G2-6, G2-7, respectively, to form NAND circuits. Also, AND circuits G3-0, G3-1, ..., G3-6, G3-7 for receiving control signals O and E are combined with the NOR circuits G2-0, G2-1, ... G2-6, G2-7, respectively. Also, reference numerals $I_0$, $I_1$, ..., $I_6$ and $I_7$ designate inverters. For example, if $A_1=A_2=A_3=$"1" and E="1", not only is the predecode signal BX0 high, but the predecode signal BX1 is also high. Also, if $A_1=$"0", $A_2=A_3=$"1" and O="1", not only the predecode signal BX1 is high, but the predecode signal BX2 is high. Thus, two of the word lines are simultaneously selected by causing the control signal O or E to be "1".

In the above-described write operation, the power supply voltage $V_{PP}$ is applied to one or more of the word lines (i.e., the control gates), and the sources or drains are grounded. As a result, electrons are expelled from the floating gates to the sources or drains ultilizing the Fowler-Nordheim tunnelling. However, the write operation can be carried out by the hot electron injection effect. In this case, when simultaneously accessing two word lines, the drain voltage may be reduced. In order to avoid this, the drain voltage can be made higher.

As explained hereinbefore, according to the present invention, since the over-erase of the unused memory cells can be compensated for, the manufacturing yield of the device can be enhanced.

I claim:

1. A method for writing, erasing and writing a nonvolatile semiconductor memory device including used memory cells and unused memory cells, comprising the steps of:

performing a first write operation upon said used memory cells;

performing an erase operation upon said used memory cells and said unused memory cells, after said first write operation is performed; and performing a second write operation upon said unused memory.

2. The method as set forth in claim 1, wherein said nonvolatile semiconductor device includes normal memory cells and redundancy memory cells said used memory cells being forming by said normal memory cells and said unused memory cells being formed by said redundancy memory cells, when all said normal memory cells are not defective, a portion of said redundancy memory cells replacing a portion of said normal memory cells so that said used memory cells are formed by said normal memory cells except for said portion of said normal memory cells and said portion of said redundancy memory cells and said unused memory cells are formed by said portion of said normal memory cells and said redundancy memory cells except for said portion of said redundancy memory cells, when said portion of said normal memory cells are defective.

3. The method as set forth in claim 1, further comprising the steps of:

performing a verifying operation upon said used memory cells and said unused memory cells to verify whether or not threshold voltages of said used memory cells and said unused memory cells are lower than an upper limit value, after said erase operation is performed; and repeating said erase operation and said verifying operation, when at least one of the threshold voltages is not lower than said upper limit value.

4. The method as set forth in claim 1, further comprising the steps of:

performing a verifying operation upon said unused memory cells to verify whether or not threshold voltages of said unused memory cells are higher than a lower limit value, after said second write operation is performed; and repeating said second write operation and said verifying operation, when at least one of the threshold voltages is not higher than said lower limit value.

5. The method as set forth in claim 1, wherein said second write operation is performed by simultaneously selecting a plurality of word lines connected to said unused memory cells.

6. The method as set forth in claim 1, wherein said second write operation is performed by using a tunnelling effect.

7. The method as set forth in claim 1, wherein said second write operation is performed by hot electron injection effect.

8. The method as set forth in claim 1, further comprising a step of performing a third write operation upon said unused memory cells, before said erase operation is performed.

9. The method as set forth in claim 8, wherein said third write operation is performed by simultaneously selecting a plurality of word lines connected to said unused memory cells.

10. The method as set forth in claim 8, wherein said third write operation is performed by using a tunnelling effect.

11. The method as set forth in claim 8, wherein said third write operation is performed by a hot electron injection effect.

12. A nonvolatile memory device comprising
   used memory cells; and
   unused memory cells whose threshold voltage is positive, wherein said used memory cells are formed by normal memory cells and said unused memory cells are formed by redundancy memory cells, when said normal memory cells are not defective, and when a portion of said normal memory cells are defective, said used memory cells being formed by said normal memory cells which are not defective and at least one of said redundancy memory cells, and said unused memory cells being formed by said defective portion of said normal memory cells and redundancy memory cells not forming said used cells.

13. The device as set forth in claim 12, further comprising means for simultaneously selecting a plurality of word lines connected to said memory cells to perform a write operation upon said memory cells through said word lines.

* * * * *